(12) United States Patent
Kurita et al.

(10) Patent No.: US 8,569,626 B2
(45) Date of Patent: Oct. 29, 2013

(54) CONTACT

(75) Inventors: Tomohisa Kurita, Kasugai (JP); Hideo Yumi, Kasugai (JP); Tatsuya Nakamura, Inuyama (JP); Kenji Konda, Nagoya (JP); Hiroki Kitano, Kasugai (JP)

(73) Assignee: Kitagawa Industries Co., Ltd., Naka-Ku, Nagoya-Shi, Aichi-Ken (JP)

( * ) Notice: Subject to any disclaimer, the term of this patent is extended or adjusted under 35 U.S.C. 154(b) by 0 days.

(21) Appl. No.: 13/139,099

(22) PCT Filed: Nov. 16, 2010

(86) PCT No.: PCT/JP2010/070374
§ 371 (c)(1),
(2), (4) Date: Jun. 10, 2011

(87) PCT Pub. No.: WO2011/059094
PCT Pub. Date: May 19, 2011

(65) Prior Publication Data
US 2012/0217050 A1      Aug. 30, 2012

(30) Foreign Application Priority Data

Nov. 16, 2009  (JP) ................................. 2009-261076
Mar. 9, 2010   (JP) ................................. 2010-051832

(51) Int. Cl.
*H01R 4/04*        (2006.01)
(52) U.S. Cl.
USPC ........................................................ 174/94 R
(58) Field of Classification Search
USPC ............................................... 174/94 R, 261
See application file for complete search history.

(56) References Cited

U.S. PATENT DOCUMENTS 3,977,757 A * 8/1976 Yurtin ........................... 439/852
5,709,574 A * 1/1998 Bianca et al. .................. 439/858
6,051,781 A * 4/2000 Bianca et al. .................. 174/351
(Continued)

FOREIGN PATENT DOCUMENTS

JP      3192570 B2     7/2001
JP    2002-170615 A   6/2002
JP    2008-091245 A   4/2008

OTHER PUBLICATIONS

Notice of Reason(s) for Rejection, issued in corresponding Japanese application No. 2010-051832, dated May 22, 2012. 2 pages.
English translation of Notice of Reason(s) for Rejection, issued in corresponding Japanese application No. 2010-051832 dated May 22, 2012. 2 pages.

(Continued)

*Primary Examiner* — Chau Nguyen
(74) *Attorney, Agent, or Firm* — Davis & Bujold, PLLC; Michael J. Bujold

(57) ABSTRACT

A contact includes a solder bonding portion, an elastic contact portion, and a suction portion. An undersurface of the solder bonding portion is a solder bonding face which is to be solder bonded to the conductor pattern. The elastic contact portion is connected to one end of the solder bonding portion and bent over the solder bonding portion. When in contact with a conductive member, the elastic contact portion is pressed against the conductive member while being elastically deformed. The suction portion is connected to the solder bonding portion independently of the elastic contact portion. The suction portion is made a suction face for a suction nozzle of an automatic mounter, with its top end being arranged in parallel to the undersurface of the solder bonding portion on the conductive member side of the elastic contact portion.

15 Claims, 17 Drawing Sheets

(56) References Cited

U.S. PATENT DOCUMENTS

| | | | |
|---|---|---|---|
| 6,398,559 B2 * | 6/2002 | Tanaka | 439/66 |
| 6,493,241 B1 * | 12/2002 | Horng | 361/818 |
| 6,627,813 B2 * | 9/2003 | Chen | 174/390 |
| 6,898,087 B1 * | 5/2005 | Chen | 361/804 |
| 7,170,006 B1 * | 1/2007 | Burrell et al. | 174/94 R |
| 7,578,712 B2 * | 8/2009 | Chang | 439/816 |
| 7,989,045 B2 * | 8/2011 | Chang | 428/98 |
| 8,052,428 B2 * | 11/2011 | Tsao | 439/66 |

OTHER PUBLICATIONS

Notice of Transmittal of Translation of the International Preliminary Report on Patentability, form PCT/IB/338. 1 page.

International Preliminary Report on Patentability, form PCT/IB/373. 1 page.

English translation of Written Opinion of the International Searching Authority, form PCT/ISA/237. 4 pages.

* cited by examiner

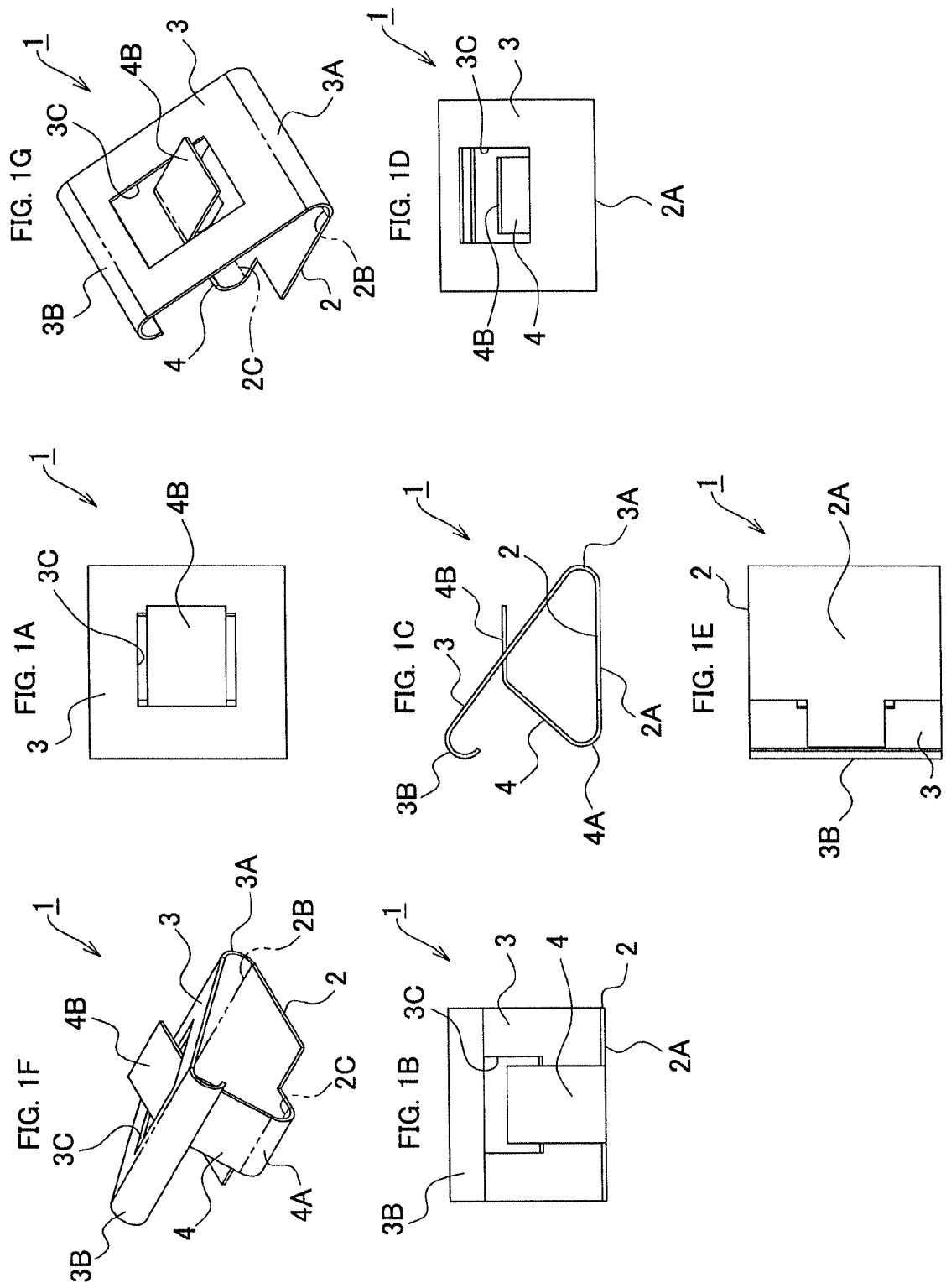

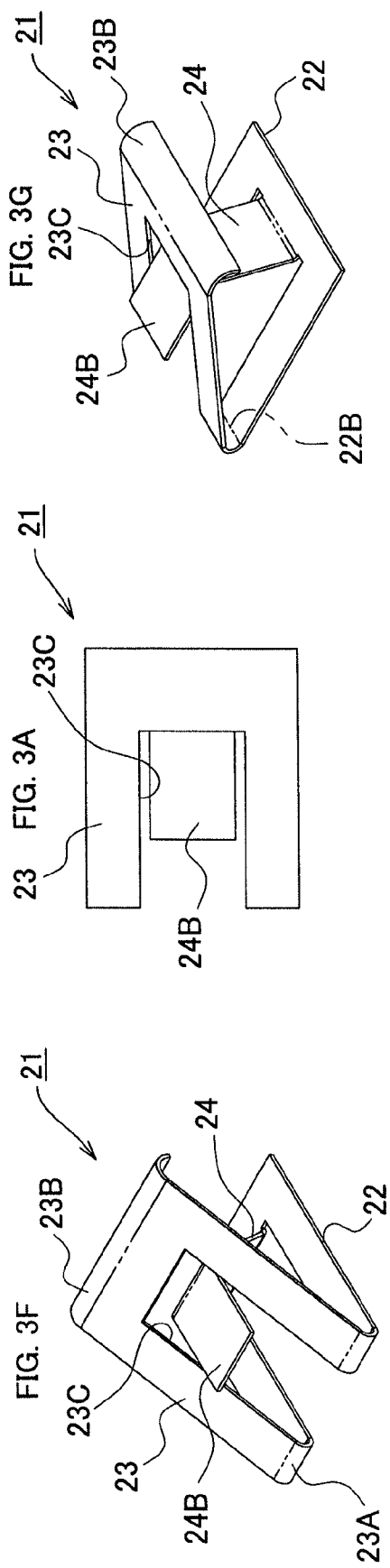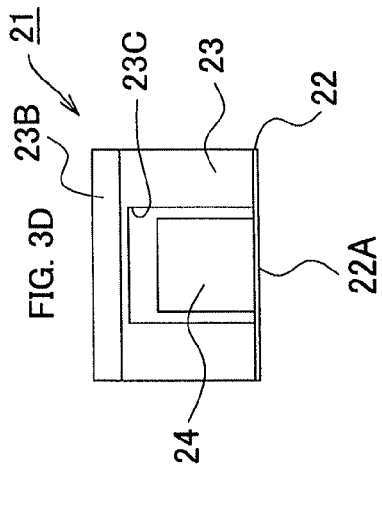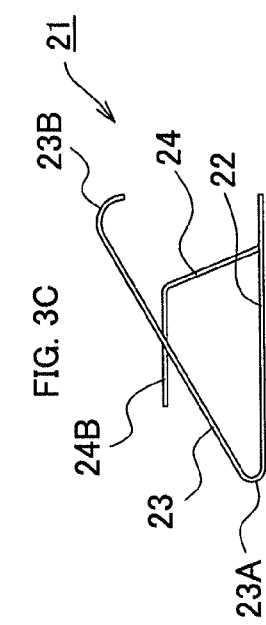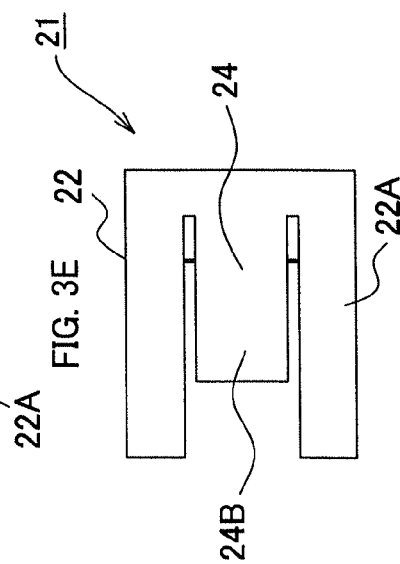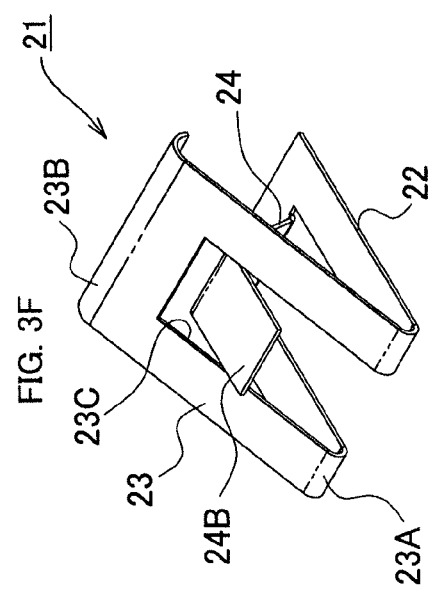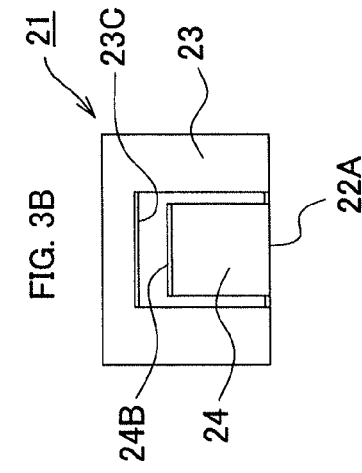

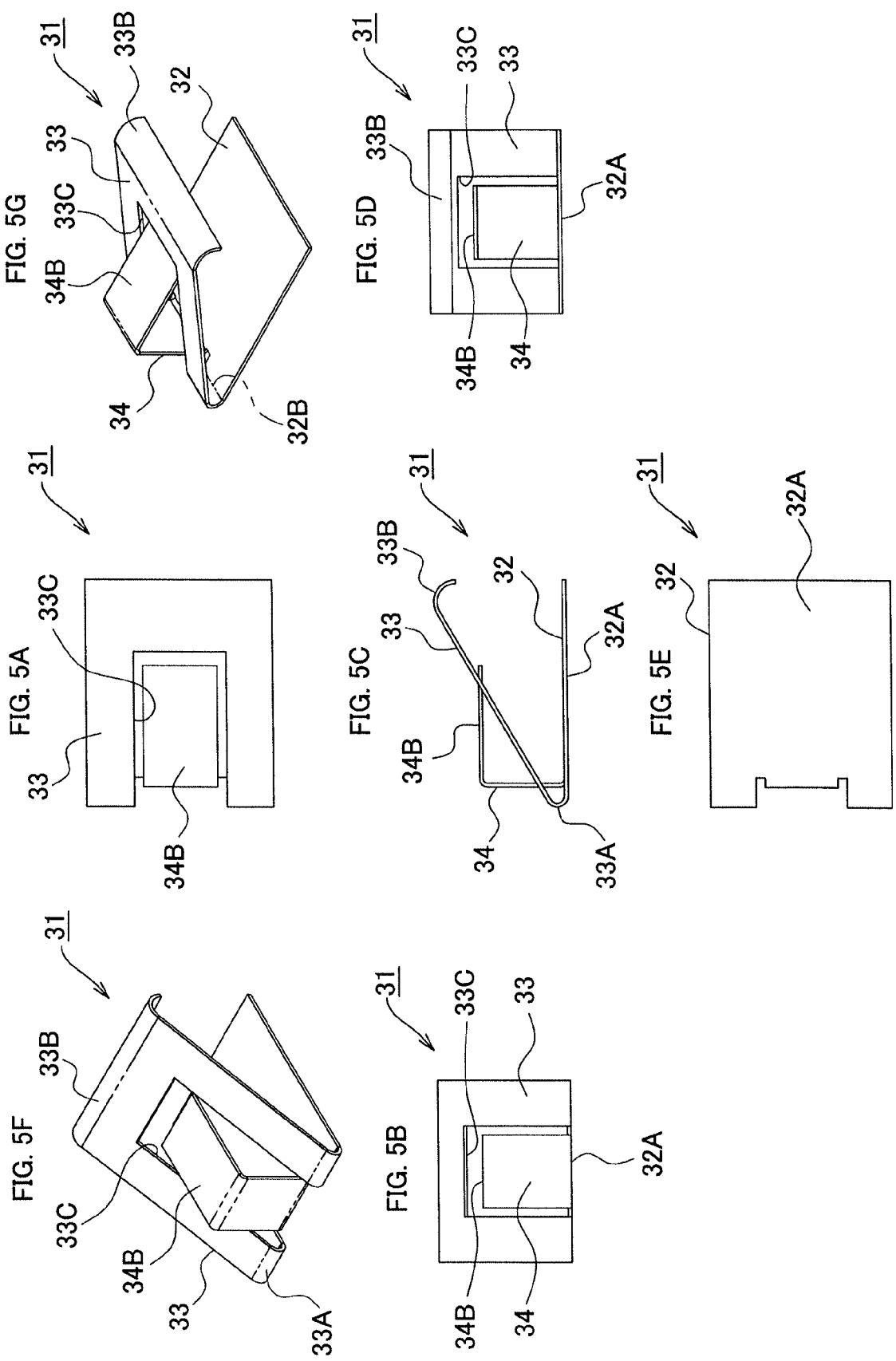

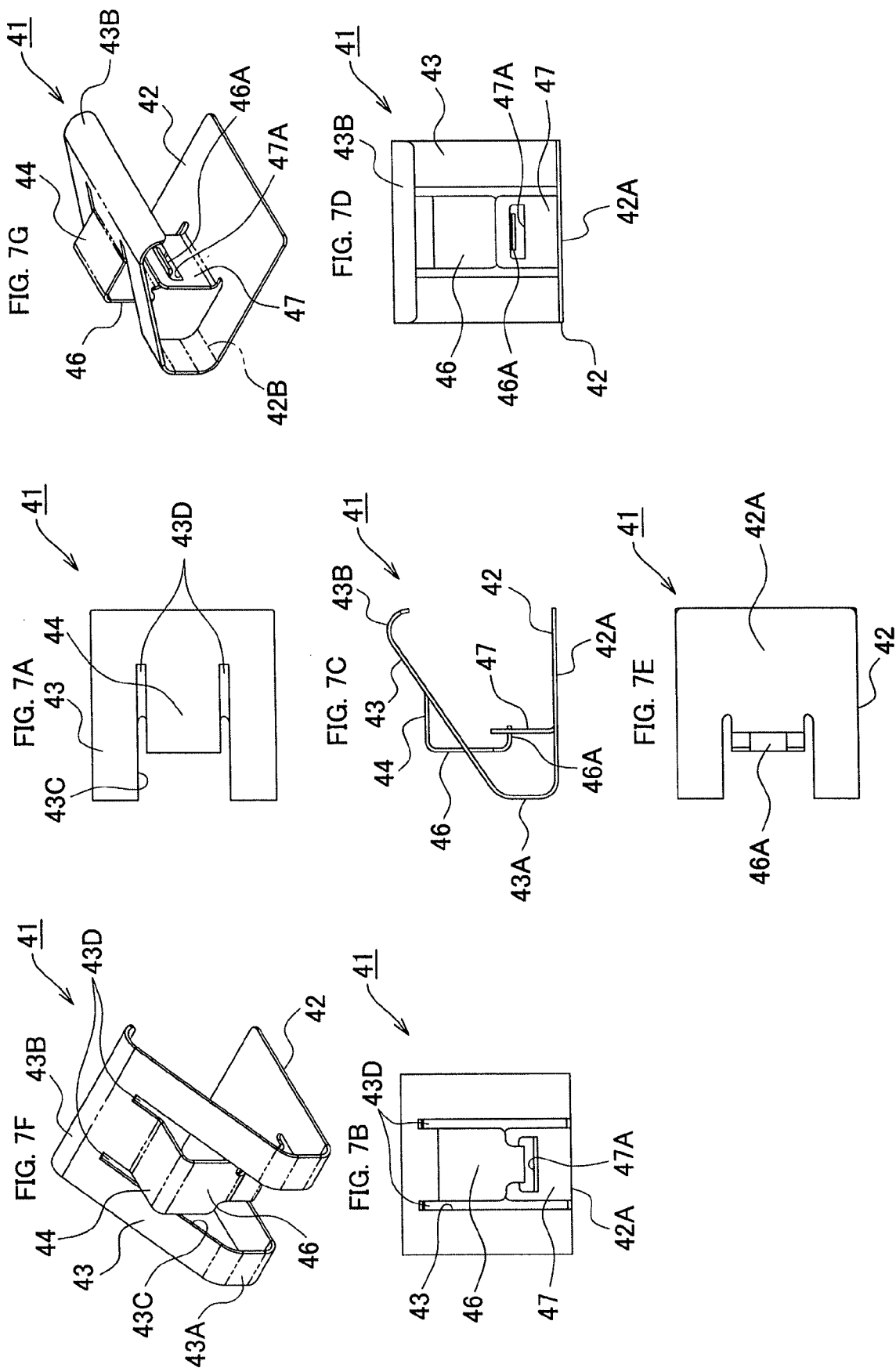

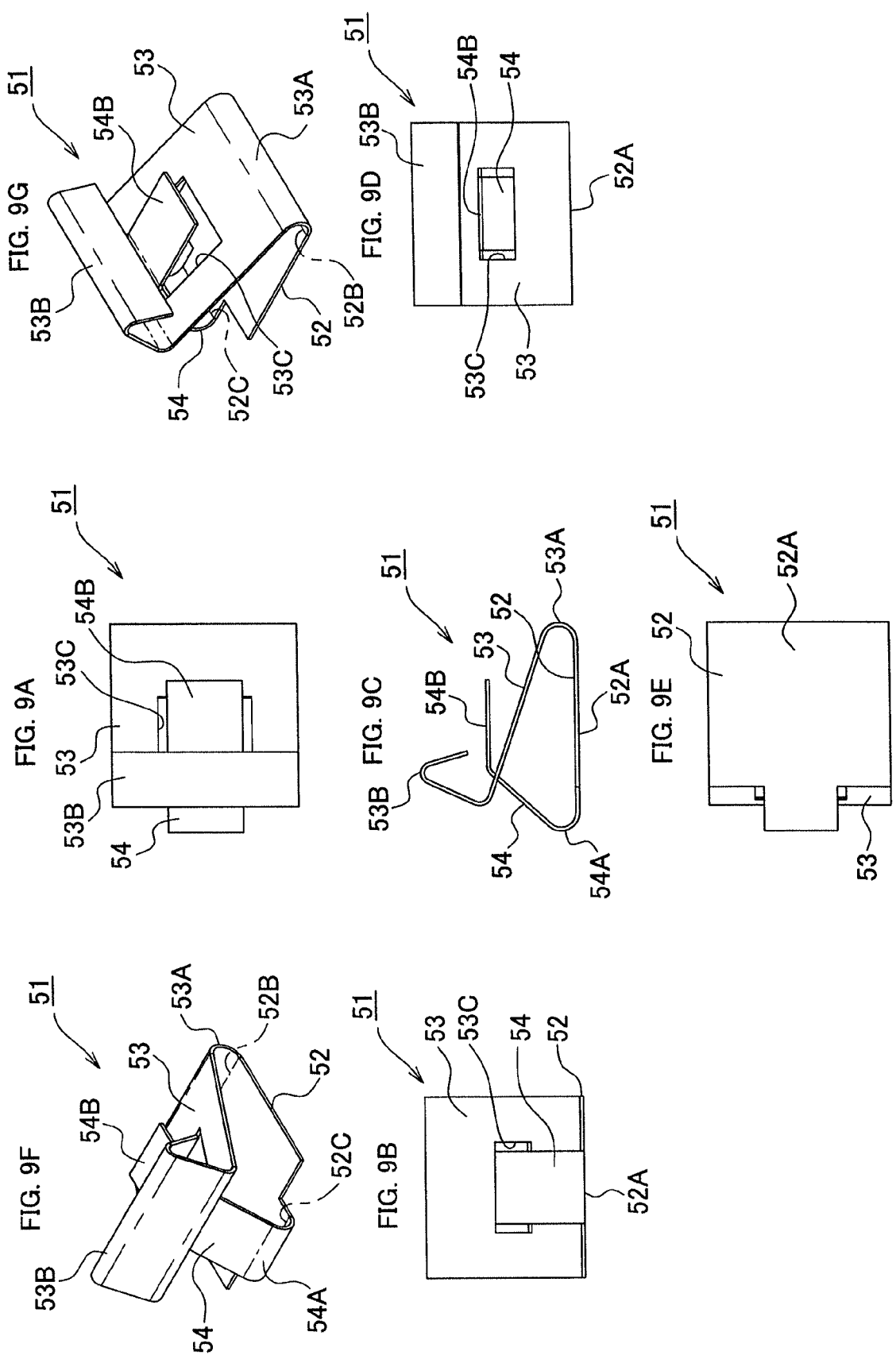

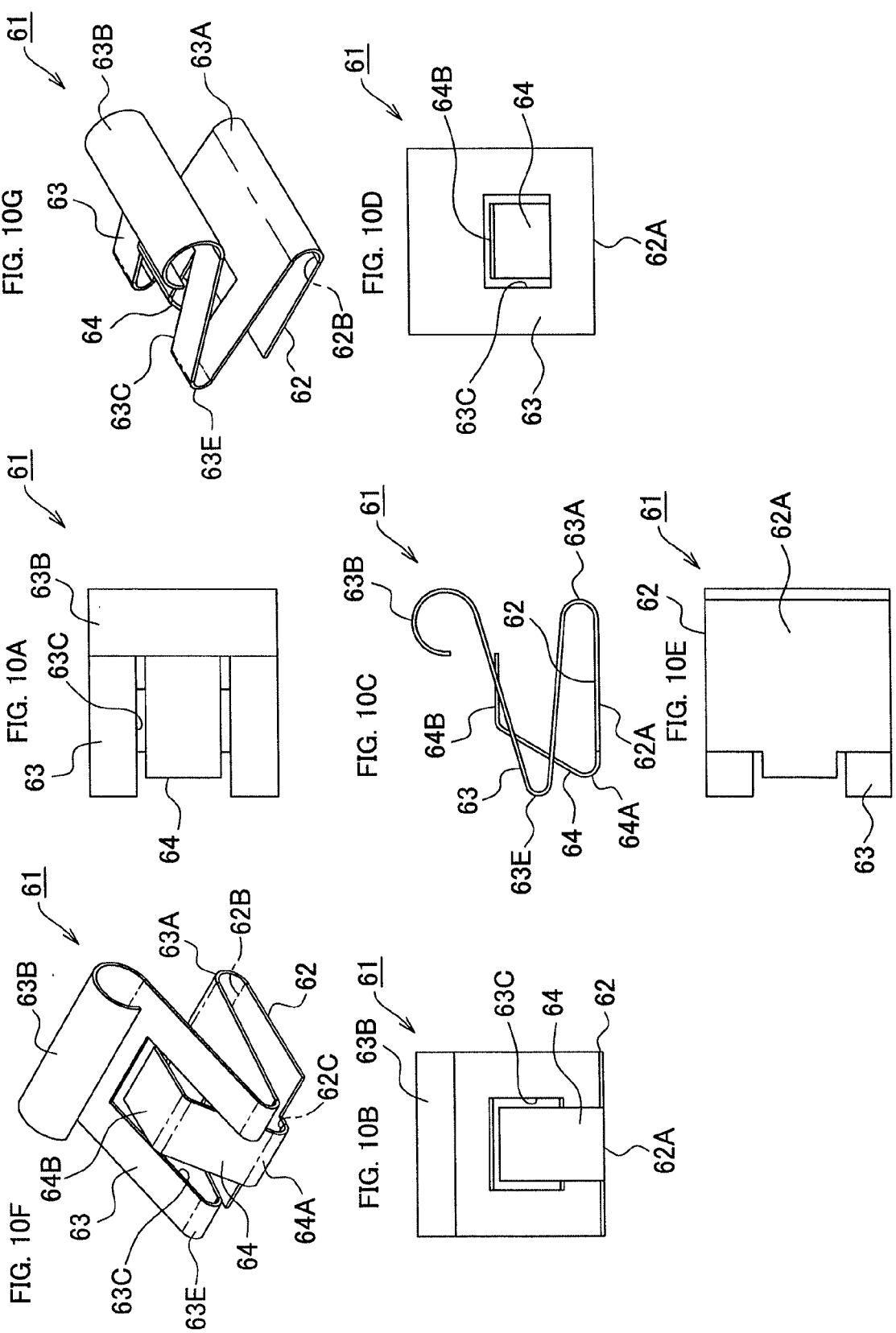

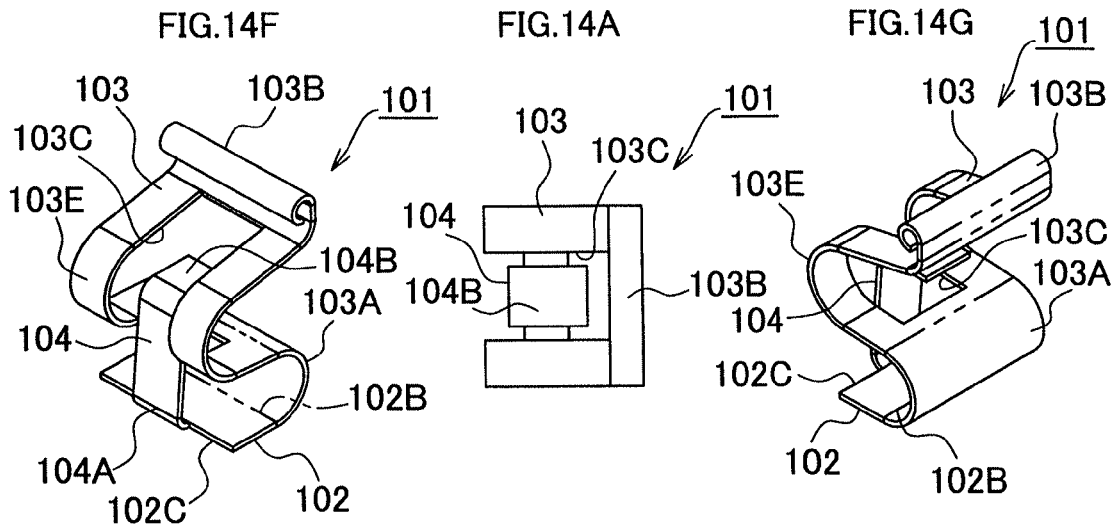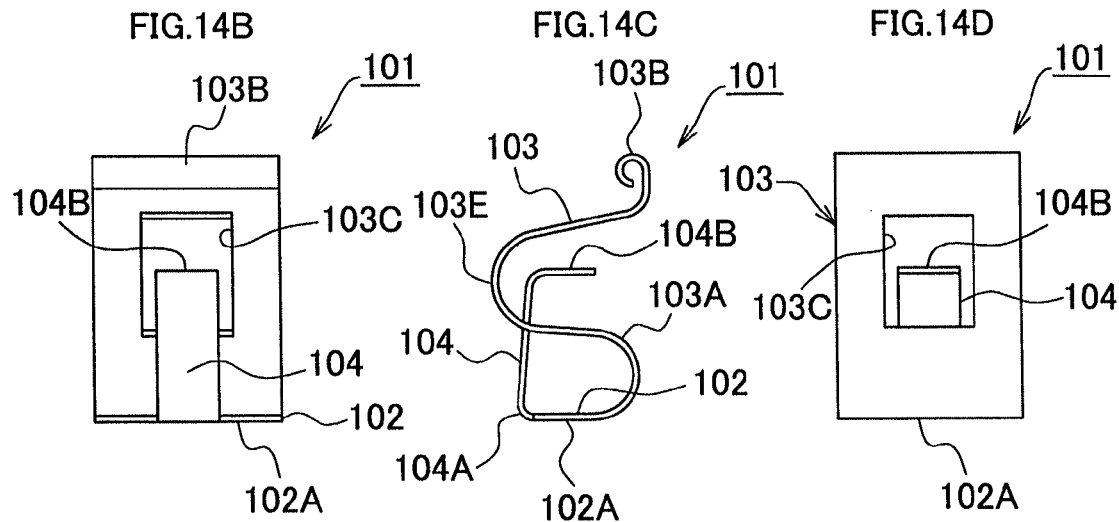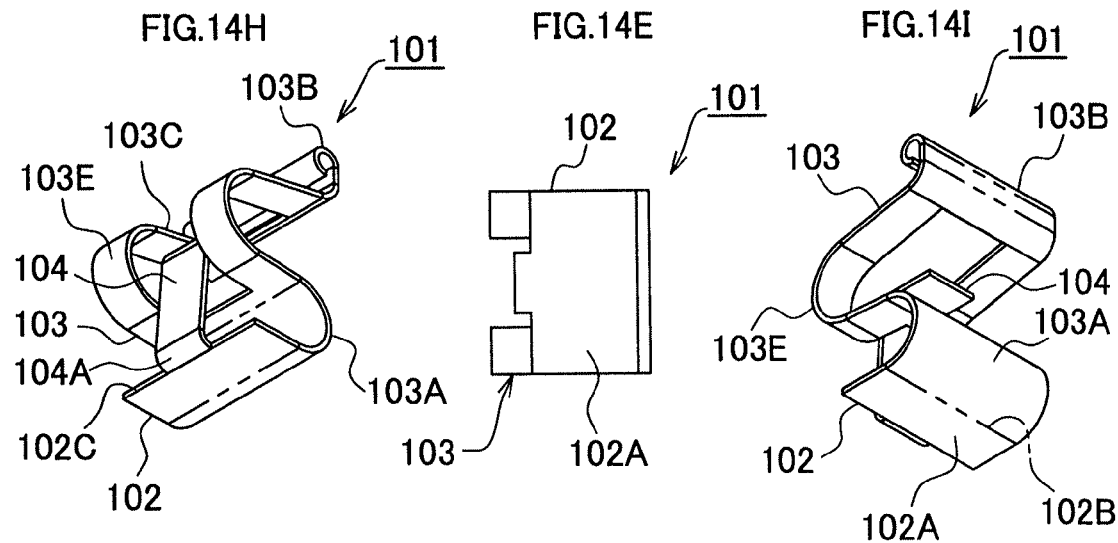

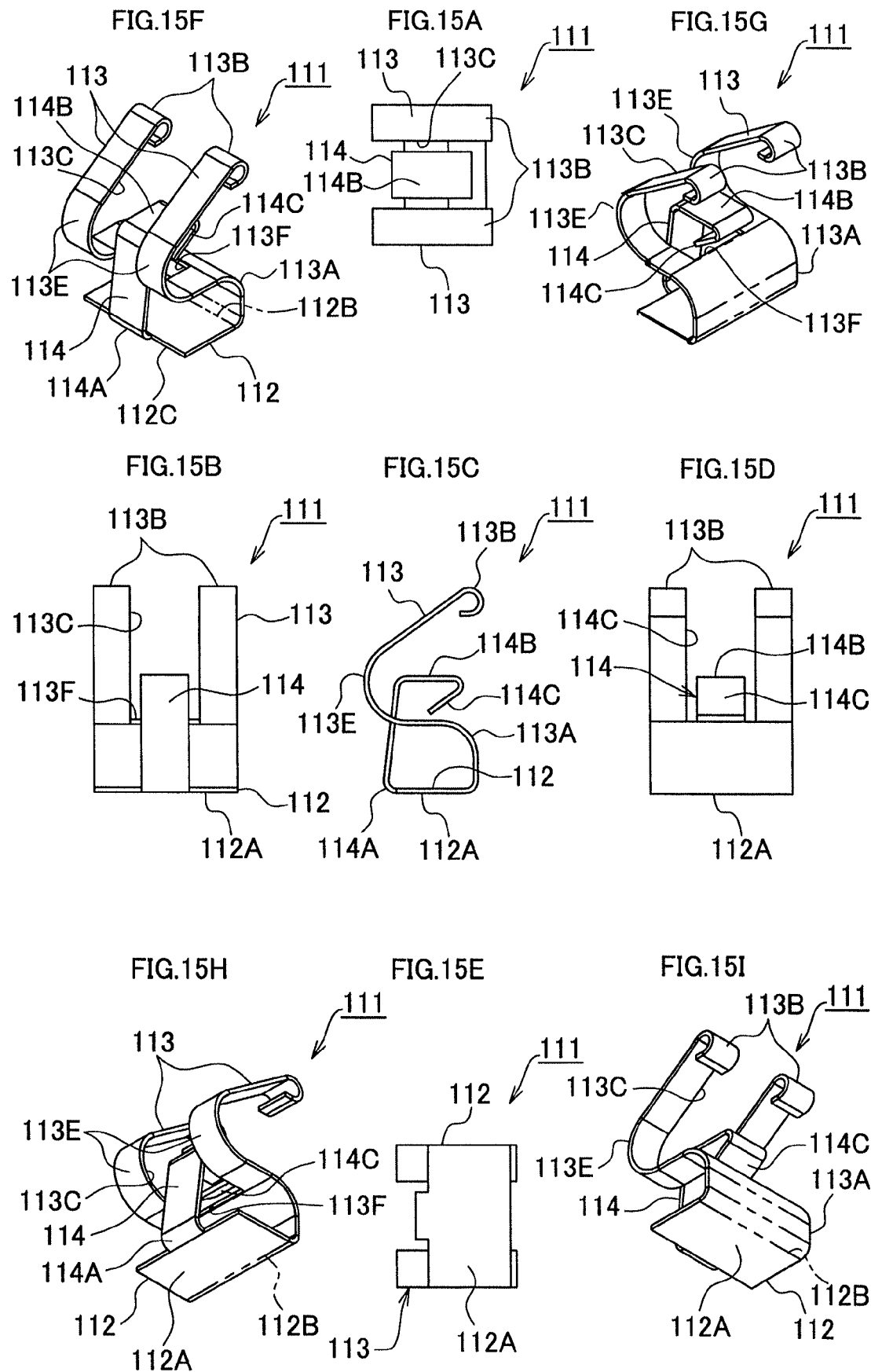

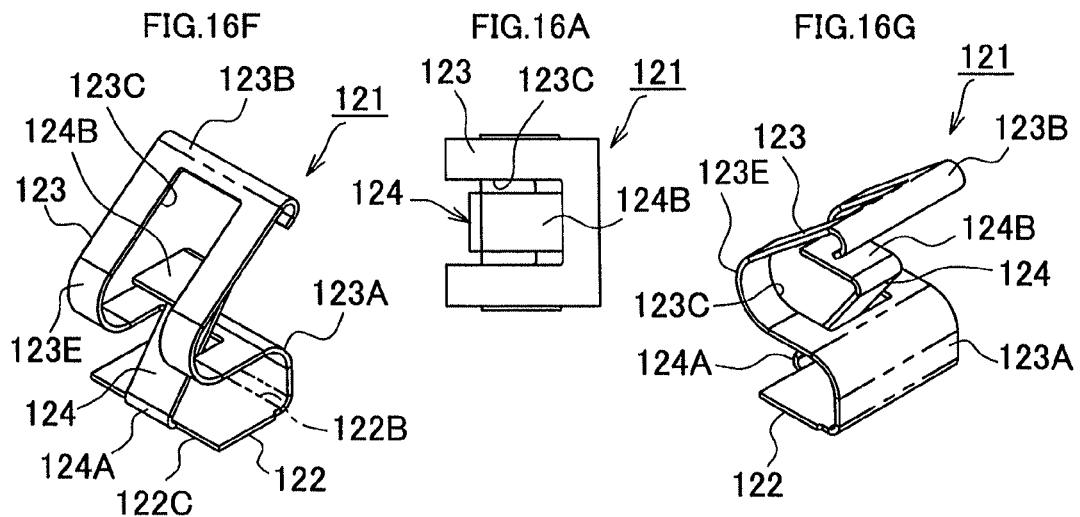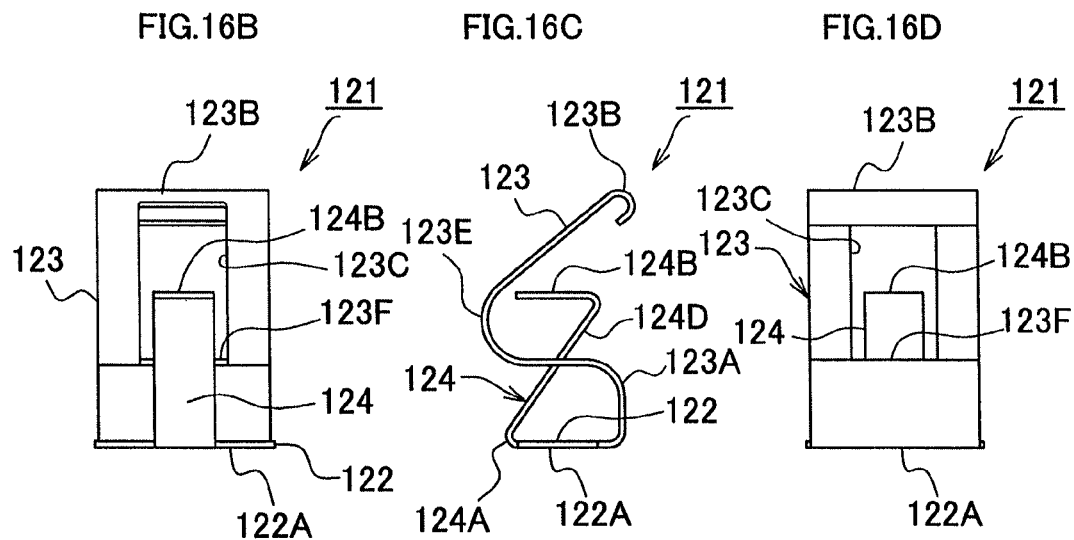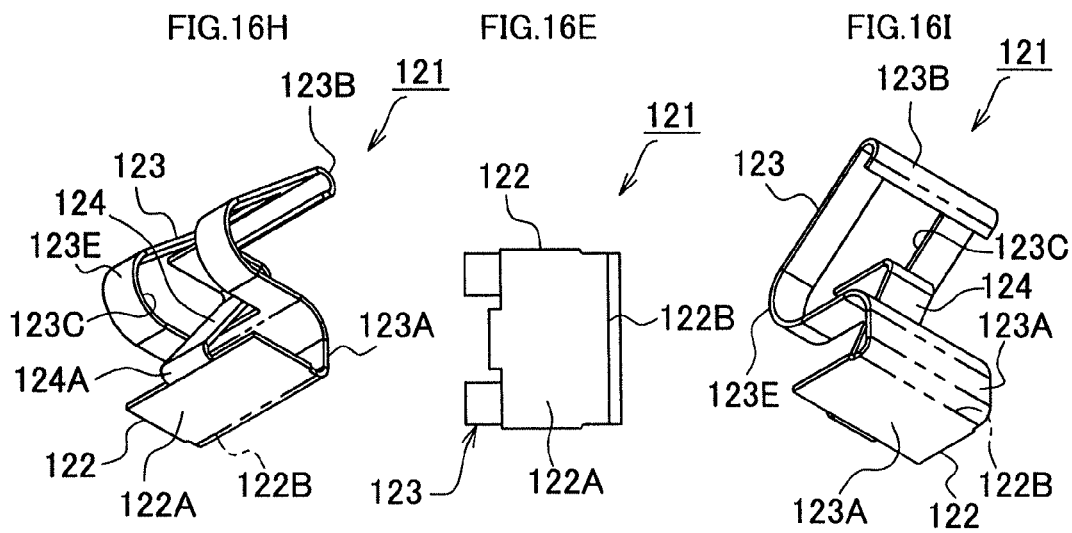

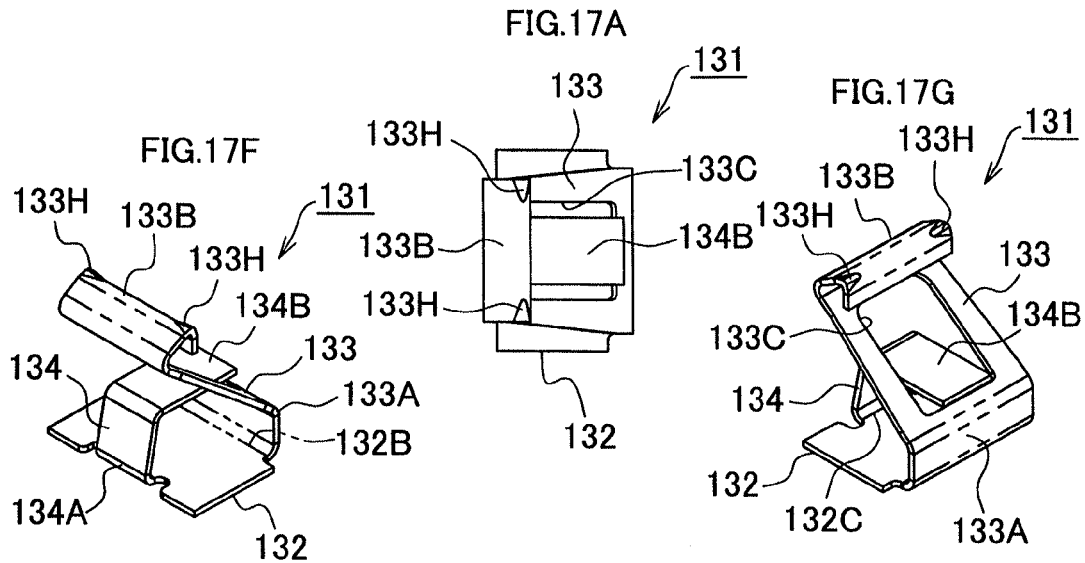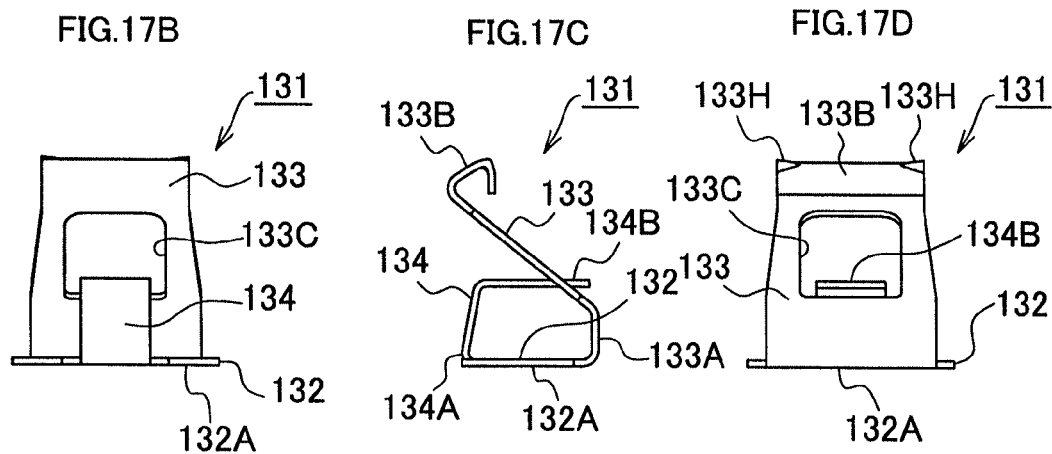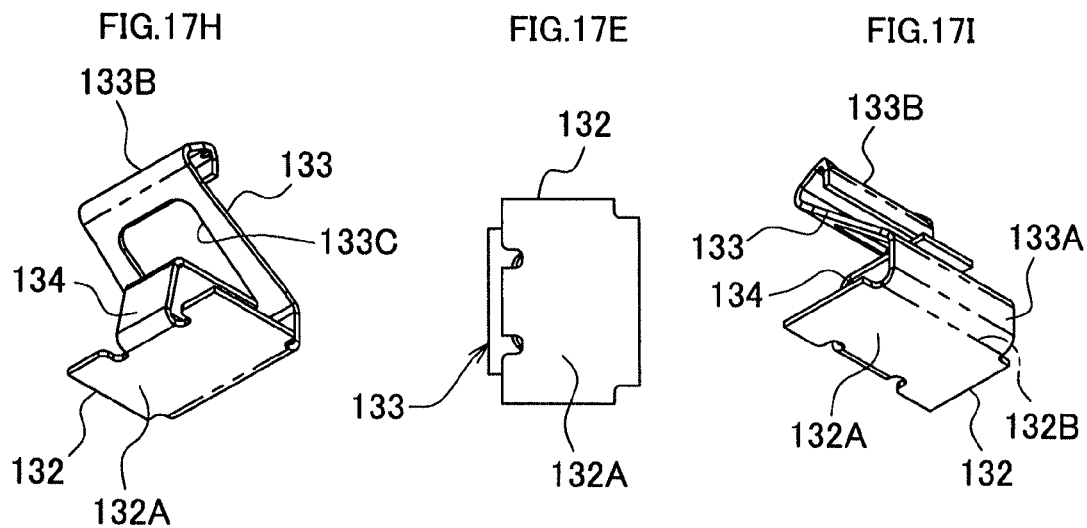

CONTACT

CROSS-REFERENCE TO RELATED APPLICATIONS

This application claims the benefit of Japanese Patent Application No. 2009-261076 filed Nov. 16, 2009 and No. 2010-51832 filed Mar. 9, 2010 in the Japan Patent Office, the disclosures of which are incorporated herein by reference.

TECHNICAL FIELD

The present invention relates to a contact which is surface mounted on a mounting surface of a printed wiring board. By being clamped between the printed wiring board and a conductive member which is different from the printed wiring board, the contact electrically connects a conductor pattern provided in the print wiring board and the conductive member.

BACKGROUND ART

As a conventionally known contact of this type, a contact including a solder bonding portion and an elastic contact portion is proposed. An undersurface of the solder bonding portion is a solder bonding face which is to be solder bonded to the conductor pattern. The elastic contact portion is connected to one end of the solder bonding portion and bent over the solder bonding portion. When in contact with the conductive member, the elastic contact portion is pressed against the conductive member while being elastically deformed. The contact configured as above is used by solder bonding the undersurface of the solder bonding portion (solder bonding face) with the conductor pattern of the printed wiring board, and bringing the conductive member, such as a ground conductor, into contact with the elastic contact portion connected to one end of the solder bonding portion from above, to make the elastic contact portion elastically deformed. Then, the elastic contact portion is pressed against the conductive member by the elastic deformation. The conductor pattern of the printed wiring board and the conductive member can be electrically connected.

In addition, there has been an attempt to automatically mount this type of contact on the printed wiring board by sucking the contact by a suction nozzle of an automatic mounter. In that case, it is proposed to connect a first main body portion arranged parallel to the undersurface of the solder bonding portion with a top end of the elastic contact portion and use the first main body portion as a suction face for the suction nozzle (see Patent Document 1, for example).

PRIOR ART DOCUMENT

Patent Document

Patent Document 1: Examined Japanese Patent Publication No. 3192570

DISCLOSURE OF THE INVENTION

Problems to be Solved by the Invention

In case that the first body portion having the suction face is connected to the top end of the elastic contact portion, permanent deformation sometimes occurs in the elastic contact portion by excess pushing of the suction nozzle into the suction face. Then, product characteristics of the elastic contact portion, such as a pressure contact force against the conductive member, may be altered. Also, if the first main body portion is connected to the top end of the elastic contact portion, a length from the bent-over part to the top end of the elastic contact portion (so-called stroke) is shortened by the first main body. The present invention has been made for the purpose of providing a contact which can be automatically mounted by a suction nozzle without change in product characteristics, and which can favorably ensure the stroke.

Means to Solve the Problems

A first aspect of the present invention provides a contact formed by bending a thin metal plate.

The contact is surface mounted on a mounting surface of a printed wiring board when used. The contact is clamped between the printed wiring board and a conductive member, which is different from the printed wiring board, thereby to electrically connect a conductor pattern provided in the printed wiring board and the conductive member.

The contact includes a solder bonding portion, an elastic contact portion, and a suction portion. An undersurface of the solder bonding portion is a solder bonding face to be solder bonded to the conductor pattern. The elastic contact portion is connected to one end of the solder bonding portion and bent over the solder bonding portion. When in contact with a conductive member, the elastic contact portion is elastically deformed to be pressed against the conductive member. The suction portion is connected to the solder bonding portion independently of the elastic contact portion. A top end of the suction portion is arranged in parallel to the undersurface of the solder bonding portion on the conductive member side of the elastic contact portion. Thereby, the suction portion is made a suction face for a suction nozzle of an automatic mounter.

The contact of the present invention configured as above is formed by bending the thin metal plate. The undersurface of the solder bonding portion (solder bonding face) is solder bonded to the conductor pattern of the printed wiring board. The elastic contact portion connected to one end of the solder bonding portion and bent over the solder bonding portion is pressed against the conductive member with elastic deformation when in contact with the conductive member. The contact of the present invention is used by bringing the conductive member (e.g., a ground conductor, a shielding plate, etc.) into contact from above the elastic contact portion and elastically deforming the elastic contact portion. Then, the elastic contact portion is pressed against the conductive member due to the elastic deformation so as to allow electrical connection between the conductor pattern on the printed wiring board and the conductive member.

The top end of the suction portion is arranged parallel to the undersurface of the solder bonding portion on the conductive member side of the elastic contact portion. The top end is made a suction face for a suction nozzle of an automatic mounter. The suction portion is connected to the solder bonding portion independently of the elastic contact portion. Therefore, even if the suction nozzle is pushed onto the suction face, distortion of the elastic contact portion can be inhibited since the suction face is independent of the elastic contact portion. The product characteristics of the contact can be stably maintained. Further, the suction face of the top end of the suction portion is arranged on the conductive member side of the elastic contact portion. Thus, the stroke of the elastic contact portion needs not be reduced in order to provide the suction portion. By securing the stroke of the elastic contact portion, the elastic contact portion can be favorably pressed against the conductive member. Further, the conductor pattern of the printed wiring board and the conductive member can be favorably electrically connected.

In the present invention, the suction portion penetrates a hole section formed in the elastic contact portion. The hole section may be of size such that the suction portion does not disturb the elastic deformation of the elastic contact portion. In this case, even if an external force parallel to the one end is applied to the elastic contact portion, an inner wall surface of the hole section abuts on the suction portion thereby to inhibit the elastic contact portion from falling. Further, since the hole section is of size such that the suction portion does not disturb the elastic deformation of the elastic contact portion, the product characteristics are not changed by the suction portion penetrating the hold portion.

A second aspect of the present invention provides a contact formed by bending a thin metal plate. The contact includes a later-described defining portion.

The contact of the second aspect is surfaced mounted on a mounting surface of a printed wiring board when used. The contact is clamped between the printed wiring board and a conductive member, which is different from the printed wiring board, thereby to electrically connect a conductor pattern provided in the printed wiring board and the conductive member.

The contact includes a solder bonding portion, an elastic contact portion, a suction portion, and a defining portion. An undersurface of the solder bonding portion is a solder bonding face to be solder bonded to the conductor pattern. The elastic contact portion is connected to one end of the solder bonding portion and bent over the solder bonding portion. When in contact with a conductive member, the elastic contact portion is elastically deformed to be pressed against the conductive member. The suction portion is connected between a bent-over portion where the elastic contact portion is bent and a contact portion where the elastic contact portion is brought into contact with the conductive member. The suction portion is arranged in parallel to the undersurface of the solder bonding portion on the conductive member side of the elastic contact portion. Thereby, the suction portion is made a suction face for a suction nozzle of an automatic mounter. The defining portion is connected to the suction portion. The defining portion is arranged at a position to be able to define a distance between the suction portion and the solder bonding portion when the elastic contact portion is not elastically deformed. When the elastic contact portion is elastically deformed, the defining portion is displaced along with the elastic deformation, so as to be arranged at a position not to obstruct the elastic deformation of the elastic contact portion.

The contact of the present invention constituted as above is formed by bending a thin metal plate. The undersurface of the solder bonding portion (solder bonding face) is solder bonded to the conductor pattern of the printed wiring board. The elastic contact portion connected to one end of the solder bonding portion and bent over the solder bonding portion is pressed against the conductive member with elastic deformation when in contact with the conductive member. The contact of the present invention is used by bringing the conductive member (e.g., a ground conductor, a shielding plate, etc.) into contact from above the elastic contact portion and elastically deforming the elastic contact portion. Then, the elastic contact portion is pressed against the conductive member due to the elastic deformation so as to allow electrical connection between the conductive pattern on the printed wiring board and the conductive member.

The suction portion of the present invention is connected to the elastic contact portion between the bent portion where the elastic contact portion is bent and the contact portion where the elastic contact portion is brought into contact with the conductive member. The suction portion is arranged in parallel to the undersurface of the solder bonding portion on the conductive member side of the elastic contact portion. Thereby, the suction portion is made a suction face for a suction nozzle of an automatic mounter. Further, the defining portion as below is connected to the elastic contact portion. Specifically, the defining portion is arranged at a position to be able to define the distance between the suction portion and the solder bonding portion in a propped manner when the elastic contact portion is not elastically deformed. When the elastic contact portion is elastically deformed, the defining portion is displaced along with the elastic deformation, so as to be arranged at a position not to obstruct the elastic deformation of the elastic contact portion.

Since the elastic contact portion is not elastically deformed when the suction nozzle of the automatic mounter is automatically mounted, the distance between the suction portion and the solder bonding portion is defined by the defining portion. Accordingly, even if the suction nozzle is pushed onto the suction face, distortion of the elastic contact portion can be inhibited since displacement of the suction portion is inhibited by the defining portion. The product characteristics can be stably maintained. Further, the suction portion is arranged on the conductive member side of the elastic contact portion. Thus, the stroke of the elastic contact portion needs not be reduced in order to provide the suction portion. By securing the stroke of the elastic contact portion, the elastic contact portion can be favorably pressed against the conductive member. Further, the conductor pattern of the printed wiring board and the conductive member can be electrically connected successfully.

When the elastic contact portion is elastically deformed by the contact with the conductive member, the defining portion is displaced along with the elastic deformation thereby to be arranged at a position not to obstruct the elastic deformation of the elastic contact portion. Thus, the product characteristics are not to be changed by providing the defining portion.

In the present invention, a lower end of the defining portion is bent to a direction following the undersurface of the solder bonding portion. A frame portion which surrounds the lower end of the defining portion when the elastic contact portion is not elastically deformed is formed in the solder bonding portion. When the elastic contact portion is elastically deformed, the lower end of the defining portion may go out of the frame portion along with the elastic deformation. In this case, when the elastic contact portion is not elastically deformed, the lower end of the defining portion bent to the direction following the undersurface of the solder bonding portion is surrounded by the frame portion formed in the solder bonding portion. Therefore, even in case that an external force is applied to the elastic contact portion in a direction parallel to the one end, the lower end of the defining portion abuts on an inner wall surface of the frame portion. Thus, deformation of the elastic contact portion can be inhibited. Further, when the elastic contact portion is elastically deformed, the lower end of the defining portion goes out of the frame portion along with the elastic deformation. Thus, the product characteristics would not be changed by the lower end of the defining portion being surrounded by the frame portion.

Further, in either of the above inventions, a shape of the elastic contact portion projected onto the solder bonding face may be identical to the solder bonding face or include the solder bonding face. In this case, an area of an external form of the elastic contact portion can be made larger than that of the solder bonding face. Effects of arranging the suction face of the suction portion on the conductive member side of the elastic contact portion and securing the stroke are exerted all the more significantly.

Further, in either of the above inventions, a length from the one end of the solder bonding portion to a top end of the elastic contact portion may be longer than a length from the one end of the solder bonding portion to the other end of the solder bonding portion. In this case as well, the effects of arranging the suction face of the suction portion on the conductive member side of the elastic contact portion and securing the stroke are exerted all the more significantly.

Further, in either of the above inventions, formation by bending one sheet of thin metal plate may be a further characteristic. In this case, manufacturing steps of the contact can be simplified. Thereby, manufacturing costs of the contact can be further reduced.

BRIEF DESCRIPTION OF THE DRAWINGS

FIGS. 1A-1G are views showing a structure of a contact according to Embodiment 1 of the present invention, where FIG. 1A is a plan view, FIG. 1B is a left side view, FIG. 1C is a front view, FIG. 1D is a right side view, FIG. 1E is a bottom view, FIG. 1F is an upper left perspective view, and FIG. 1G is an upper right perspective view.

FIGS. 3A-3G are views showing a structure of a contact according to Embodiment 2 of the present invention, where FIG. 3A is a plan view, FIG. 3B is a left side view, FIG. 3C is a front view, FIG. 3D is a right side view, FIG. 3E is a bottom view, FIG. 3F is an upper left perspective view, and FIG. 3G is an upper right perspective view.

FIGS. 5A-5G are views showing a structure of a contact according to Embodiment 3 of the present invention, where FIG. 5A is a plan view, FIG. 5B is a left side view, FIG. 5C is a front view, FIG. 5D is a right side view, FIG. 5E is a bottom view, FIG. 5F is an upper left perspective view, and FIG. 5G is an upper right perspective view.

FIGS. 7A-7G are views showing a structure of a contact according to Embodiment 4 of the present invention, where FIG. 7A is a plan view, FIG. 7B is a left side view, FIG. 7C is a front view, FIG. 7D is a right side view, FIG. 7E is a bottom view, FIG. 7F is an upper left perspective view, and FIG. 7G is an upper right perspective view.

FIGS. 9A-9G are views showing a structure of a contact according to Embodiment 5 of the present invention, where FIG. 9A is a plan view, FIG. 9B is a left side view, FIG. 9C is a front view, FIG. 9D is a right side view, FIG. 9E is a bottom view, FIG. 9F is an upper left perspective view, and FIG. 9G is an upper right perspective view.

FIGS. 10A-10G are views showing a structure of a contact according to a sixth embodiment of the present invention, where FIG. 10A is a plan view, FIG. 10B is a left side view, FIG. 10C is a front view, FIG. 10D is a right side view, FIG. 10E is a bottom view, FIG. 10F is an upper left perspective view, and FIG. 10G is an upper right perspective view.

FIG. 11A is a plan view, FIG. 11B is a left side view, FIG. 11C is a front view, FIG. 11D is a right side view, FIG. 11E is a bottom view, FIG. 11F is an upper left perspective view, FIG. 11G is an upper right perspective view, FIG. 11H is a lower left perspective view, and FIG. 11I is a lower right perspective view.

FIG. 12A is a plan view, FIG. 12B is a left side view, FIG. 12C is a front view, FIG. 12D is a right side view, FIG. 12E is a bottom view, FIG. 12F is an upper left perspective view, FIG. 12G is an upper right perspective view, FIG. 12H is a lower left perspective view, and FIG. 12I is a lower right perspective view.

FIG. 13A is a plan view, FIG. 13B is a left side view, FIG. 13C is a front view, FIG. 13D is a right side view, FIG. 13E is a bottom view, FIG. 13F is an upper left perspective view, FIG. 13G is an upper right perspective view, FIG. 13H is a lower left perspective view, and FIG. 13I is a lower right perspective view.

FIGS. 14A-14I are views showing a structure of a contact 101 according to a tenth embodiment of the present invention, where FIG. 14A is a plan view, FIG. 14B is a left side view, FIG. 14C is a front view, FIG. 14D is a right side view, FIG. 14E is a bottom view, FIG. 14F is an upper left perspective view, FIG. 14G is an upper right perspective view, FIG. 14H is a lower left perspective view, and FIG. 14I is a lower right perspective view.

FIGS. 15A-15I are views showing a structure of a contact 111 according to a eleventh embodiment of the present invention, where FIG. 15A is a plan view, FIG. 15B is a left side view, FIG. 15C is a front view, FIG. 15D is a right side view, FIG. 15E is a bottom view, FIG. 15F is an upper left perspective view, FIG. 15G is an upper right perspective view, FIG. 15H is a lower left perspective view, and FIG. 15I is a lower right perspective view.

FIGS. 16A-16I are views showing a structure of a contact 121 according to a twelfth embodiment of the present invention, where FIG. 16A is a plan view, FIG. 16B is a left side view, FIG. 16C is a front view, FIG. 16D is a right side view, FIG. 16E is a bottom view, FIG. 16F is an upper left perspective view, FIG. 16G is an upper right perspective view, FIG. 16H is a lower left perspective view, and FIG. 16I is a lower right perspective view.

FIGS. 17A-17I are views showing a structure of a contact 131 according to a thirteenth embodiment of the present invention, where FIG. 17A is a plan view, FIG. 17B is a left side view, FIG. 17C is a front view, FIG. 17D is a right side view, FIG. 17E is a bottom view, FIG. 17F is an upper left perspective view, FIG. 17G is an upper right perspective view, FIG. 17H is a lower left perspective view, and FIG. 17I is a lower right perspective view.

Figure 2A:
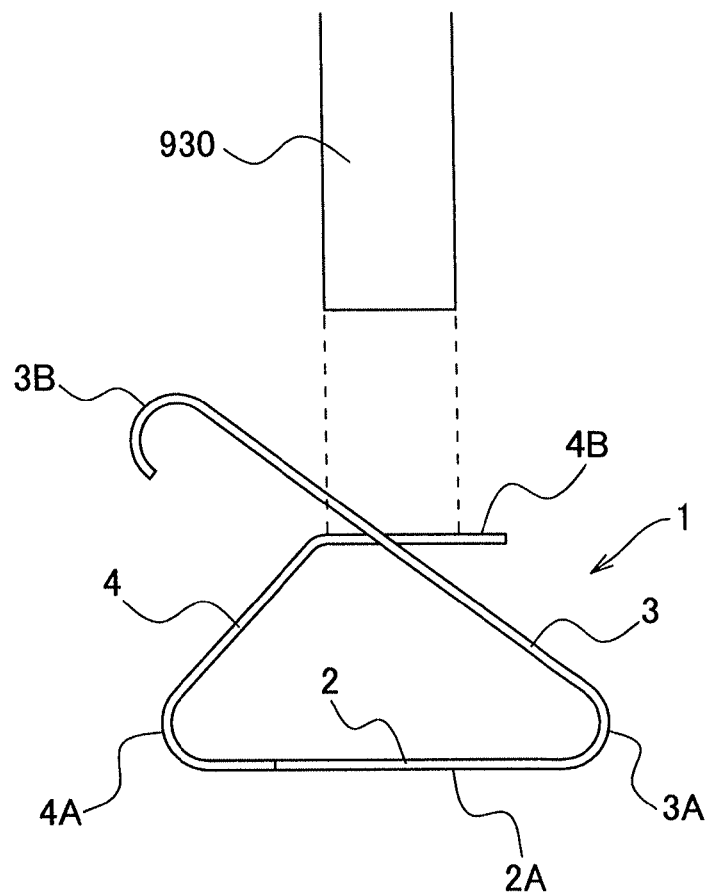
FIGS. 2A-2B are explanatory views showing how to use the contact according to Embodiment 1.

EXPLANATION OF REFERENCE NUMERALS 1, 21, 31, 41, 51, 61 . . . contact
2, 22, 32, 42, 52, 62 . . . solder bonding portion
3, 23, 33, 43, 53, 63 . . . elastic contact portion
3C, 23C, 33C, 52C, 62C . . . hole section
4, 24, 34, 44, 54, 64 . . . suction portion
46 . . . defining portion
47 . . . frame portion
910 . . . printed wiring board
920 . . . ground conductor
930 . . . suction nozzle

BEST MODE FOR CARRYING OUT THE INVENTION

The present invention will now be explained by way of embodiments, referring to the accompanying drawings. The present invention should not be limited to the below described embodiments, but may be practiced in various forms within the scope not departing from the gist of the present invention.

[Embodiment 1]

FIGS. 1A-1G are views showing a structure of a contact 1 according to Embodiment 1 of the present invention, where FIG. 1A is a plan view, FIG. 1B is a left side view, FIG. 1C is a front view, FIG. 1D is a right side view, FIG. 1E is a bottom view, FIG. 1F is an upper left perspective view, and FIG. 1G is an upper right perspective view. The contact 1 is formed by punching one sheet of thin plate made of a springy metal (e.g., phosphor bronze, beryllium copper, SUS, etc.) into a predetermined shape and bending the same.

As shown in FIGS. 1A-1G, the contact 1 includes a substantially rectangular solder bonding portion 2 of which undersurface 2A is a later-described solder bonding face. To one end 2B of the solder bonding portion 2, an elastic contact portion 3 is connected. The elastic contact portion 3 is connected to the one end 2B of the solder bonding portion 2 via a bend 3A which is curved in arch shape when viewed from front. A top end 3B of the elastic contact portion 3 is also curled downward in arch shape when viewed from front. When the top end 3B is pressed downward by some object, the elastic contact portion 3 is elastically deformed on the bend 3A so as to be pressed against the object. Further, a rectangular hole section 3C having two sides parallel to the one end 2B and two sides orthogonal to the foregoing two sides is formed between the bend 3A and the top end 3B of the elastic contact portion 3.

The other end 2C of the solder bonding portion 2 is narrowed into a convex shape. A suction portion 4 is connected to the narrowed other end 2C. The suction portion 4 is also connected to the other end 2C of the solder bonding portion 2 via a bend 4A which is curved in arch shape when viewed from front. A top end 4B of the suction portion 4 is inflected toward a direction parallel to the solder bonding portion 2, and exposed to an upper surface side of the elastic contact portion 3 through the hole section 3C of the elastic contact portion 3. Further, the overall suction portion 4 is formed into a band having a width narrower than the hole section 3C. Without application of an external force, the suction portion 4 is not in contact with any side of the hole section 3C.

Figure 2B:
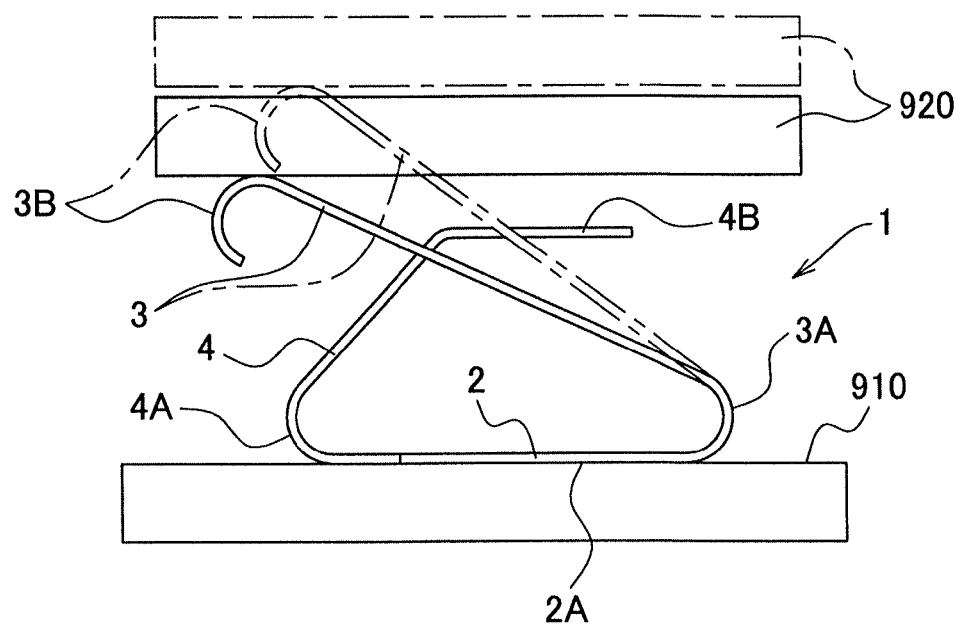

The contact 1 of the present embodiment constituted as above is used by being clamped between a printed wiring board 910 and a ground conductor 920 (which may be a shield plate, a housing or others) as an example of a conductive member, as illustrated in FIG. 2B with a solid line. In this case, the suction nozzle 930 of an automatic mounter abuts on the top end 4B of the suction portion 4 of the contact 1 which is housed in a not shown embossed tape or the like, as illustrated in FIG. 2A with a dotted line. Thereby, the top end 4b of the suction portion 4 is sucked by the suction nozzle 930. The contact 1 sucked by the suction nozzle 930 is arranged on a surface of a conductor pattern (not shown) of the printed wiring board 910. Then, the undersurface 2A of the solder bonding portion 2 is solder bonded to the conductor pattern of the printed wiring board 910.

FIG. 2B shows the solder bonded state with a dashed-dotted line. Then, the ground conductor 920 is brought into contact with the top end 3B of the elastic contact portion 3 from above. The contact 1 is used while the elastic contact portion 3 is elastically deformed, as illustrated in FIG. 2B with a solid line.

The elastic contact portion 3 is pressed against the ground conductor 920 by the elastic deformation. Thereby, the conductor pattern of the printed wiring board 910 and the ground conductor 920 can be electrically connected. The suction portion 4 is connected to the solder bonding portion 2, independently of the elastic contact portion 3, as noted above. Thus, even if the suction nozzle 930 is pushed onto an upper surface of the suction portion 4, distortion of the elastic contact portion 3 can be inhibited. Product characteristics of the contact 1 such as a pressing force of the elastic contact portion 3 against the ground conductor 920 can be stably maintained. Normally, even if the suction nozzle 930 is pushed in excessively, the top end 4B of the suction portion 4 does not abut on a lower side of the hole section 3C.

Further, the top end 4B of the suction portion 4 is arranged on the ground conductor 920 side of the elastic contact portion 3 by penetrating the hole section 3C. Thus, a stroke of the elastic contact portion 3 needs not be reduced in order to provide the suction portion 4. The shape of the elastic contact portion 3 projected onto the undersurface 2A of the solder bonding portion 2 includes the undersurface 2A of the solder bonding portion 2 (solder bonding face). Accordingly, by ensuring the stroke of the elastic contact portion 3, the elastic contact portion 3 can be favorably pressed against the ground conductor 920. Further, the conductor pattern of the printed wiring board 910 and the ground conductor 920 can be electrically favorably connected.

The contact 1 of the present embodiment, as illustrated in FIG. 2B, is recommended to be used by elastically deforming the elastic contact portion 3 to an extent that the ground conductor 920 is not brought into contact with the top end 4B of the suction portion 4. However, if the ground conductor 920 is brought into contact with the top end 4B, the suction portion 4 functions as a stopper for inhibiting the contact 1 from being excessively squashed. Also, if the suction portion 4 is brought into contact with the ground conductor 920, impedance between the conductor pattern and the ground conductor 920 changes. Thus, by measuring the impedance, it can be detected that the contact 1 is excessively squashed. Further, if lowering of the impedance is preferentially desired, the contact 1 may be used in an excessively squashed manner as above.

The top end 4B of the suction portion 4 is not brought into contact with any sides of the hole section 3C without application of an external force, and is spaced from the upper and lower sides of the hole section 3C to an extent that the suction portion 4 does not to obstruct the elastic deformation of the elastic contact portion 3. Thus, influence to the product characteristics by the suction portion 4 being in contact with the elastic contact portion 3 can be inhibited. Further, if the top end 4B of the suction portion 4 does not penetrate the hole section 3C, the elastic contact portion 3 may be deformed and turned up when an external force is applied to the elastic contact portion 3 in a direction parallel to the one end 2B. In the present embodiment, even in the case that an external force is applied, an inner wall surface of the hole section 3C abuts on the suction portion 4. Thereby, deformation of the elastic contact portion 3 can be inhibited. The contact 1 can be formed by combining a plurality of parts such as by welding. However, since the contact 1 of the present embodiment is formed by bending one sheet of thin metal plate, its production process can be simplified. Thereby, the manufacturing cost can be further reduced.

[Embodiment 2]

FIGS. 3A-3G are views showing a structure of a contact 21 according to Embodiment 2 of the present invention, where FIG. 3A is a plan view, FIG. 3B is a left side view, FIG. 3C is a front view, FIG. 3D is a right side view, FIG. 3E is a bottom view, FIG. 3F is an upper left perspective view, and FIG. 3G is an upper right perspective view. The contact 21 is configured to be the same as the contact 1, except for the components described below. Thus, reference numbers added with a number 20 to the reference numbers used in FIGS. 1A-1G and FIGS. 2A-2B are used for part of the components in the present embodiment, and detailed description thereof is not repeated.

Figure 4A:
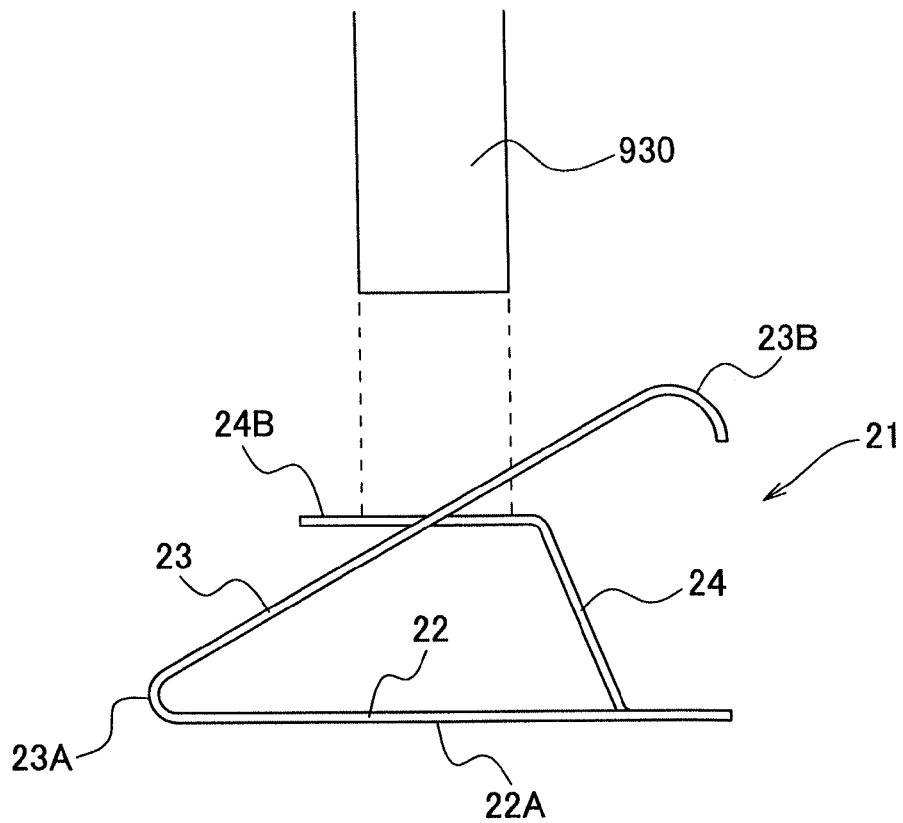
FIGS. 4A-4B are explanatory views showing how to use the contact according to the Embodiment 2.
Figure 4B:
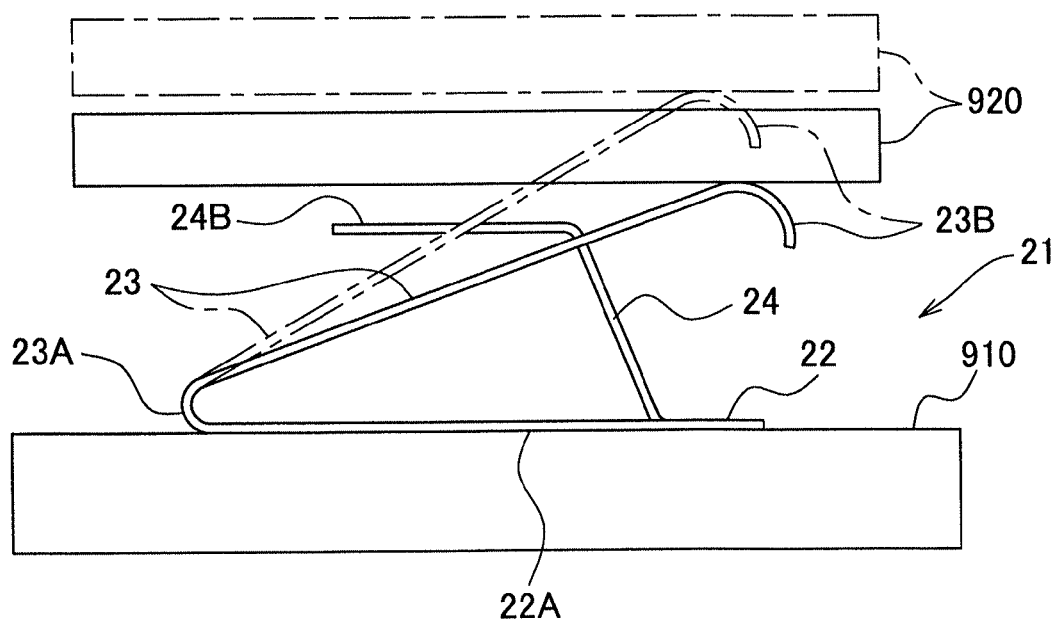

In the contact 21, a hole section 23c reaches a lower end of an elastic contact portion 23, and further extends to a solder bonding portion 22 so that one end 22B of the solder bonding portion 22 is configured into a concave shape. The concave portion of the solder bonding portion 22 is raised upward to form a suction portion 24. A top end 24A of the suction portion 24 is also bent to a direction parallel to the solder bonding portion 22 and penetrates the hole section 23C. The contact 21 in Embodiment 2 configured as such can be also sucked by the suction nozzle 930 as shown in FIG. 4A to be mounted as shown in FIG. 4B. The same operation/effect as in the contact 1 can be achieved. Also, in the contact 21, the suction portion 24 is formed by cutting and raising part of the solder bonding portion 22. Thus, loss of metal can be reduced.

[Embodiment 3]

FIGS. 5A-5G are views showing a structure of a contact 31 according to Embodiment 3 of the present invention, where FIG. 5A is a plan view, FIG. 5B is a left side view, FIG. 5C is a front view, FIG. 5D is a right side view, FIG. 5E is a bottom view, FIG. 5F is an upper left perspective view, and FIG. 5G is an upper right perspective view. The contact 31 is configured to be the same as the contact 1, except for the components described below. Thus, reference numbers added with a number 30 to the reference numbers used in FIGS. 1A-1G and FIGS. 2A-2B are used for part of the components in the present embodiment, and detailed description thereof is not repeated.

Figure 6A:
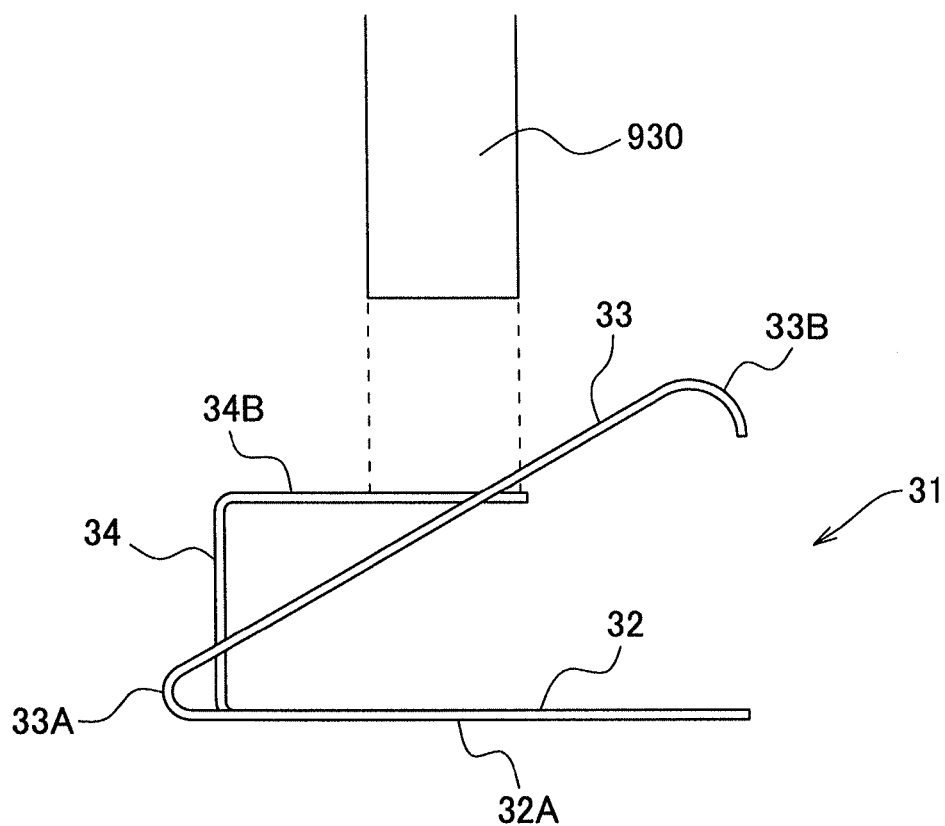
FIGS. 6A-6B are explanatory views showing how to use the contact according to the Embodiment 3.
Figure 6B:
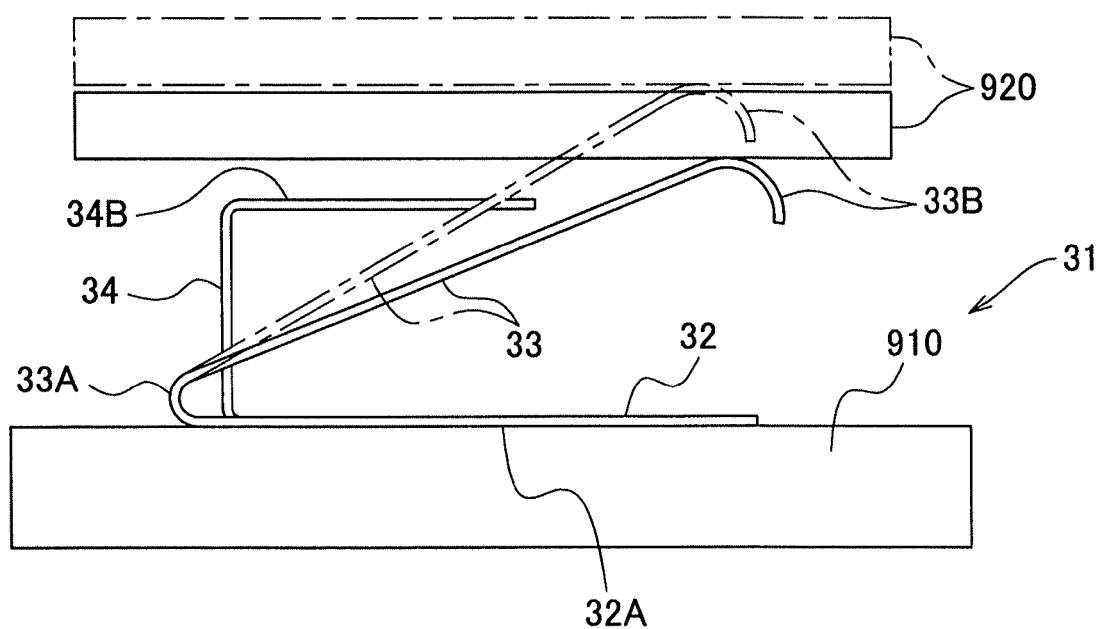

In the contact 31 as well, a hole section 33c reaches a lower end of an elastic contact portion 33, and further extends to a solder bonding portion 32 so that one end 32B of the solder bonding portion 32 is configured into a concave shape. However, a distance by which a hole section 33C extends to the solder bonding portion 32 is shorter as compared to the case of the contact 21. A portion punched out as the hole section 33C is raised upward from the solder bonding portion 32 so as to form a suction portion 34. A top end 34A of the suction portion 34 is also bent to a direction parallel to the solder bonding portion 32 and penetrates the hole section 33C. The top end 34A penetrates the hole section 33C from un upper surface side of the elastic contact portion 33. A portion of the top end 34A before penetrating the hole section 33C is made a suction face for the suction nozzle 930 as shown in FIG. 6A. The contact 31 of Embodiment 3 configured as such can be also sucked by the suction nozzle 930 as shown in FIG. 6A to be mounted as shown in FIG. 6B. The same operation/effect as in the contact 1 can be achieved. Also, in the contact 31, the suction portion 34 is formed by cutting and raising part of the elastic contact portion 33. Thus, loss of metal can be reduced.

[Embodiment 4]

FIGS. 7A-7G are views showing a structure of a contact 41 according to Embodiment 4 of the present invention, where FIG. 7A is a plan view, FIG. 7B is a left side view, FIG. 7C is a front view, FIG. 7D is a right side view, FIG. 7E is a bottom view, FIG. 7F is an upper left perspective view, and FIG. 7G is an upper right perspective view. The contact 41 is configured to be the same as the contact 1, except for the components described below. Thus, reference numbers added with a number 40 to the reference numbers used in FIGS. 1A-1G and FIGS. 2A-2B are used for part of the components in the present embodiment, and detailed description thereof is not repeated.

In the contact 41 as well, a hole section 43c reaches a lower end of an elastic contact portion 43, and further extends to a solder bonding portion 42 so that one end 42B of the solder bonding portion 42 is configured into a concave shape. In the present embodiment, a portion punched out as the hole section 43C constitutes a suction portion 44, a defining portion 46 and a frame portion 47 as below.

The suction portion 44 is connected to an upper side of the hole section 43C to be arranged in parallel to the solder bonding portion 42. The defining portion 46 is connected to a top end of the suction portion 44 to be arranged so as to be orthogonal to the solder bonding portion 42. The frame portion 47 is connected to the solder bonding portion 42, and is raised from the solder bonding portion 42 so as to be orthogonal to the solder bonding portion 42 and parallel to the defining portion 46. A rectangular hole section 47A is formed in the frame portion 47. A lower end 46A of the defining portion 46 is bent to a direction along an undersurface 42A of the solder bonding portion 42 and inserted to the aforementioned hole section 47A. The lower end 46A inserted to the hole section 47A is in contact with or extremely adjacent to an upper side of the hole section 47A, but is spaced from the other three sides.

Figure 8A:
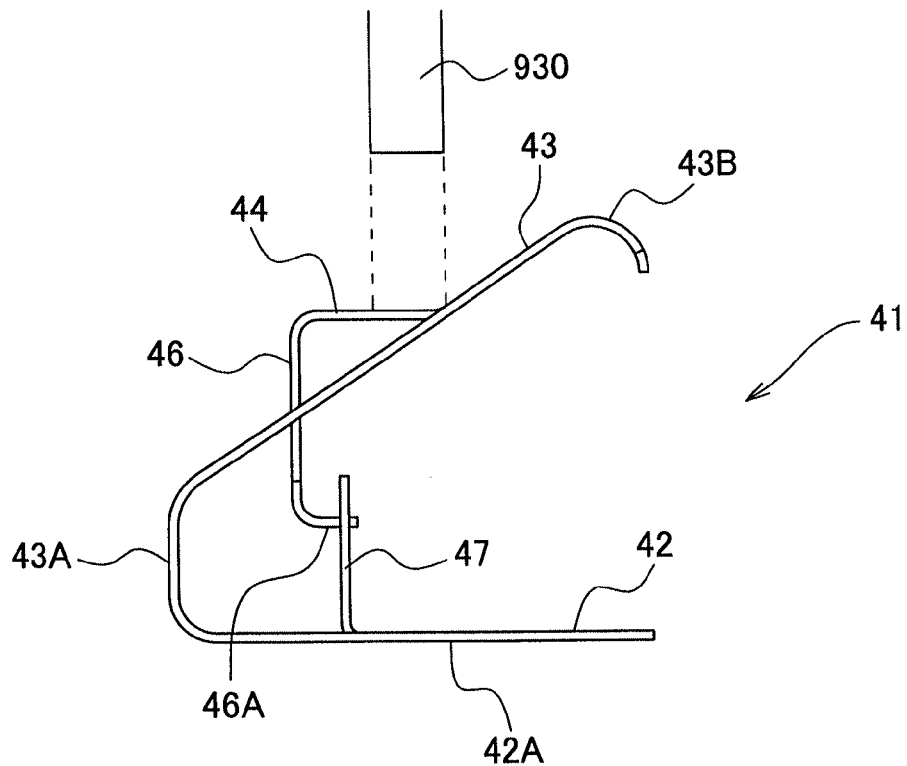
FIGS. 8A-8B are explanatory views showing how to use the contact according to the Embodiment 4.

In the contact 41 configured as such, the suction nozzle 930 of the automatic mounter abuts on the suction portion 44, as illustrated in FIG. 8A with a dotted line. Thereby, the suction portion 44 is sucked by the suction nozzle 930. Even if the suction nozzle 930 is pushed onto an upper surface of the suction portion 44, the lower end 46A of the defining portion 46 abuts on a lower side of the hole section 47A of the frame portion 47. The defining portion 46 serves as a prop thereby defining a distance between the suction portion 44 and the solder bonding portion 42. As a result, distortion of the elastic contact portion 43 can be inhibited. Product characteristics of the contact 41 such as a pressing force of the elastic contact portion 43 against the ground conductor 920 can be stably maintained. In this case, the suction portion 44 is pushed slightly downward. However, since a slit 43D is formed toward a top end 43B (corresponding to a contact portion) of the elastic contact portion 43 at both ends of a base of the suction portion 44 (see FIGS. 7A-7G), distortion of the elastic contact portion 43 which may be caused by a move of the suction portion 44 can be also inhibited.

Figure 8B:
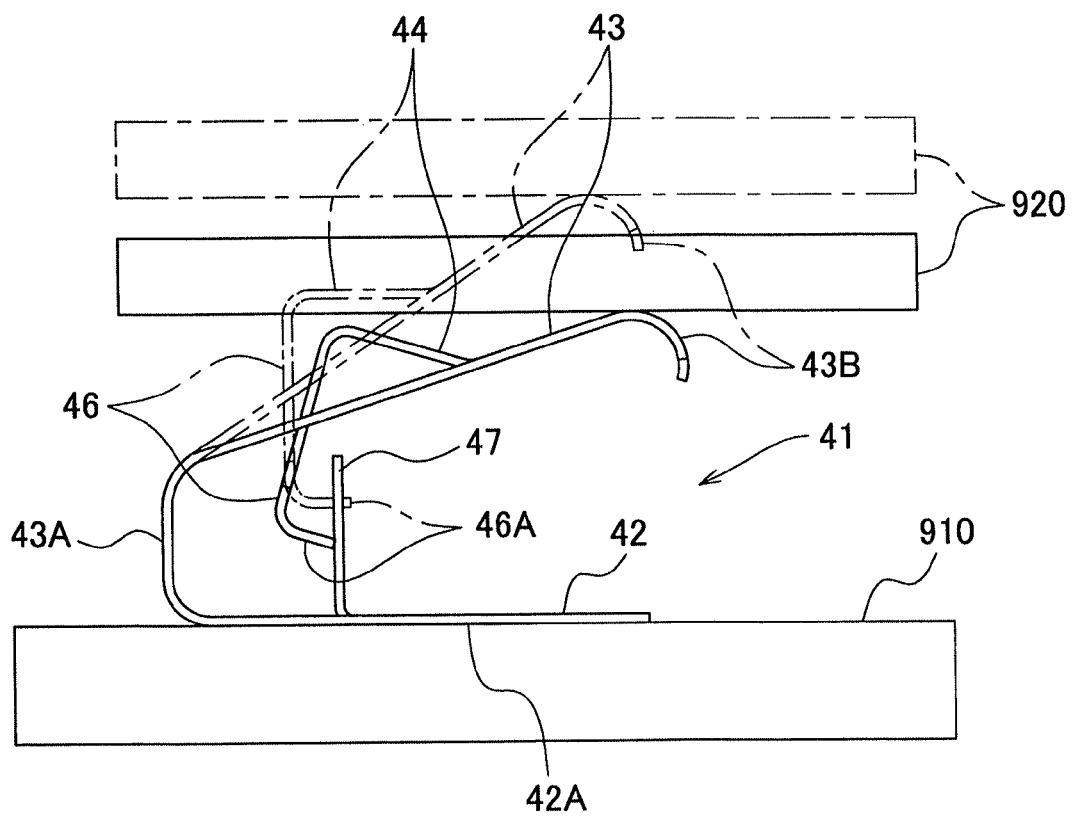

Further, as the top end 43B of the elastic contact portion 43 is brought into contact with the ground conductor 920 so that the elastic contact portion 43 is elastically deformed as illustrated in FIG. 8B, the lower end 46A of the defining portion 46 is displaced in such a manner as to slip out of the hole section 47A of the frame portion 47 along with the elastic deformation. As a result, the defining portion 46 no longer serves as a prop and does not inhibit the elastic deformation. The product characteristics can be inhibited from being affected by the defining portion 46.

Further, since the suction portion 44 is arranged on the ground conductor 920 side of the elastic contact portion 43, a stroke of the elastic contact portion 43 needs not be reduced in order to provide the suction portion 44. The shape of the elastic contact portion 43 projected onto the undersurface 42A of the solder bonding portion 42 includes the undersurface 42A of the solder bonding portion 42. Accordingly, by ensuring the stroke of the elastic contact portion 43, the elastic contact portion 43 can be favorably pressed against the ground conductor 920. Further, the conductor pattern of the printed wiring board 910 and the ground conductor 920 can be electrically favorably connected.

The contact 41 of the present embodiment is recommended to be used by elastically deforming the elastic contact potion 3 to an extent that the ground conductor 920 is not brought into contact with the suction portion 44, as illustrated in FIG. 8B. In case that it is desired to use the contact 41 as multiple contacts, the contact 41 may be used in a state excessively squashed so that the suction portion 44 is brought into contact with the ground conductor 920.

Further, if the lower end 46A of the defining portion 46 is not inserted into the hole section 47A when an external force is not applied to the contact 41, and if an external force is applied to the elastic contact portion 43 in a direction parallel to the one end 42B of the solder bonding portion 42, the elastic contact portion 43 may be deformed and turned up. In contrast, in the present embodiment, even if an external force is applied in the aforementioned direction, the lower end 46A of the defining portion 46 abuts on an inner wall surface of the hole section 47A of the frame portion 47. Thereby, deformation of the elastic contact portion 43 can be inhibited. The contact 41 can be also formed by combining a plurality of parts by welding. However, since the contact 41 of the present embodiment is formed by bending one sheet of thin metal plate, the production process of the contact 41 can be simplified. Thereby, the manufacturing cost can be further reduced. Also, in the contact 41 as well, the suction portion 44, the defining portion 46 and the frame portion 47 are formed by cutting and raising part of the elastic contact portion 43 and the solder bonding portion 42. Thus, loss of metal can be reduced.

[Embodiment 5]

FIGS. 9A-9G are views showing a structure of a contact 51 according to Embodiment 5 of the present invention, where FIG. 9A is a plan view, FIG. 9B is a left side view, FIG. 9C is a front view, FIG. 9D is a right side view, FIG. 9E is a bottom view, FIG. 9F is an upper left perspective view, and FIG. 9G is an upper right perspective view. The contact 51 is different from the contact 1 only in the configuration of an elastic contact portion 53. A solder bonding portion 52 and a suction portion 54 are configured to be substantially the same as those in the contact 1. Thus, reference numbers added with a number 50 to the reference numbers used in FIGS. 1A-1G and FIGS. 2A-2B are used for part of the components in the present embodiment, and detailed description thereof is not repeated.

In the contact 51, a top end 53B of the elastic contact portion 53 is bent upward on a side nearer to the top end than a hole section 53C, and is further folded in arch shape when viewed from front toward a top end 54B of the suction portion 54 exposed through the hole section 53C. With this configuration, the top end 53B of the elastic contact portion 53 is arranged on a side inner than an other end 52C of the solder bonding portion 52, i.e., upward of the solder bonding portion 52. In the contact 51 of Embodiment 5 configured as such, the top end 54B of the suction portion 54 can be also sucked by the suction nozzle 930 (see FIGS. 2A-2B). The same operation/effect as in the contact 1 can be achieved. Also, in the contact 51, the top end 53B is bent upward as noted above. Thus, when pressed by the ground conductor 920 and the like, the elastic contact portion 53 is favorably inhibited from laterally popping out from above the solder bonding portion 52.

[Embodiment 6]

FIGS. 10A-10G are views showing a structure of a contact 61 according to Embodiment 6 of the present invention, where FIG. 10A is a plan view, FIG. 10B is a left side view, FIG. 10C is a front view, FIG. 10D is a right side view, FIG. 10E is a bottom view, FIG. 10F is an upper left perspective view, and FIG. 10G is an upper right perspective view. The contact 61 is different from the contact 1 only in the configuration of an elastic contact portion 63. A solder bonding portion 62 and a suction portion 64 are configured to be substantially the same as those in the contact 1. Thus, reference numbers added with a number 60 to the reference numbers used in FIGS. 1A-1G and FIGS. 2A-2B are used for part of the components in the present embodiment, and detailed description thereof is not repeated.

The elastic contact portion 63 of the contact 61 is folded via a bend 63E which is curved in its middle in arch shape when viewed from front, and is configured into a substantially chevron shape when viewed from front as a whole. Also, a top end 63B of the elastic contact portion 63 is curled upward in arch shape when viewed from front. With this configuration, the top end 63B of the elastic contact portion 63 is arranged on a side inner than one end 62B of the solder bonding portion 62, i.e., upward of the solder bonding portion 62. Further, a hole section 63C is formed to extend over the bend 63E.

In the contact 61 of Embodiment 6 configured as such, the top end 64B of the suction portion 64 can be also sucked by the suction nozzle 930 (see FIGS. 2A-2B). The same operation/effect as in the contact 1 can be achieved. Also, in the contact 61, the contact elastic portion 63 is folded in the middle as noted above. Thus, when pressed by the ground conductor 920 and the like, the elastic contact portion 63 is favorably inhibited from laterally popping out from above the solder bonding portion 62. Also, a large stroke can be secured.

[Embodiment 7]

Figure 11F:
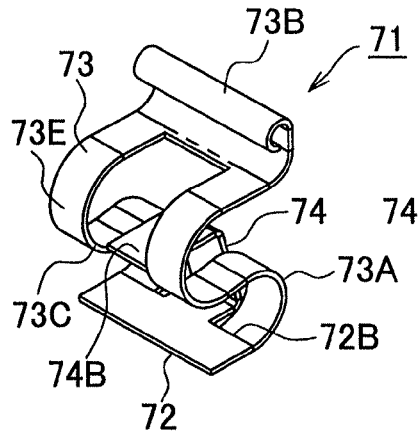
FIGS. 11A-11I are views showing a structure of a contact 71 according to a seventh embodiment of the present invention, where
Figure 11A:
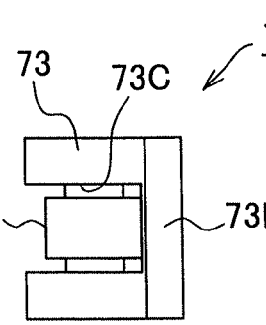
Figure 11G:
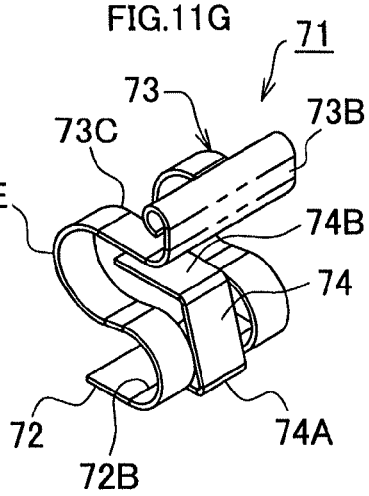
Figure 11B:
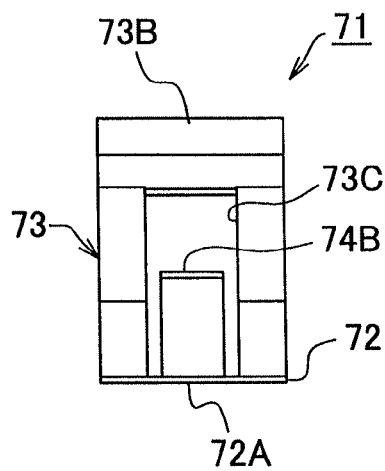
Figure 11C:
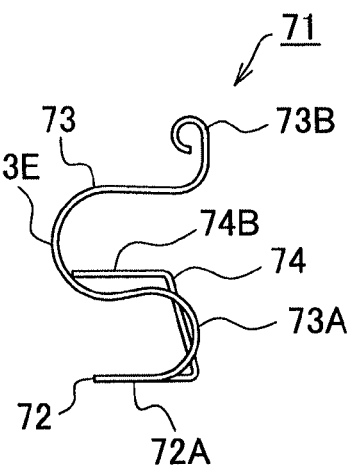
Figure 11D:
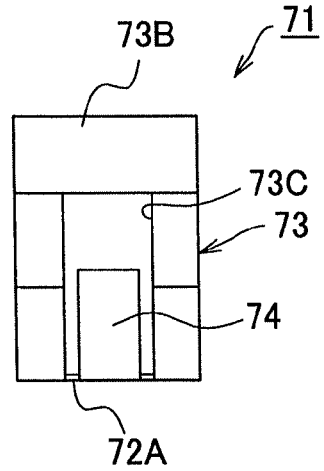
Figure 11H:
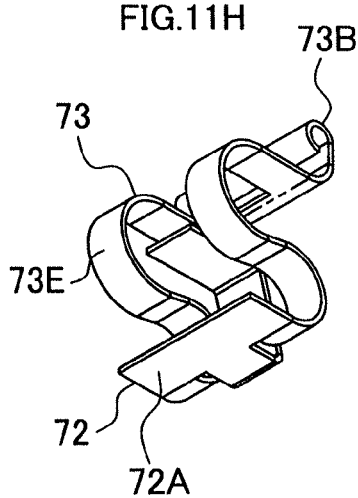
Figure 11E:
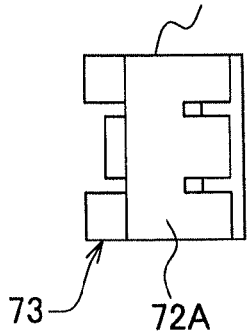
Figure 11I:
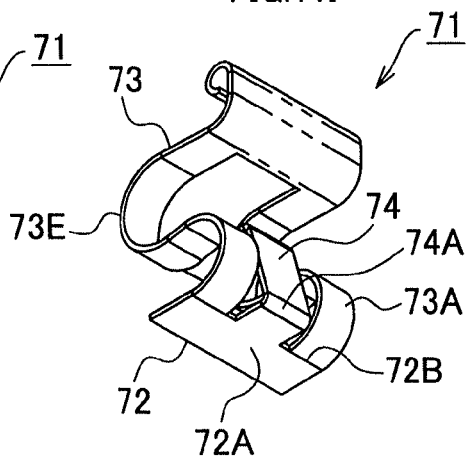

FIGS. 11A-11I are views showing a structure of a contact 71 according to Embodiment 7 of the present invention, where FIG. 11A is a plan view, FIG. 11B is a left side view, FIG. 11C is a front view, FIG. 11D is a right side view, FIG. 11E is a bottom view, FIG. 11F is an upper left perspective view, FIG. 11G is an upper right perspective view, FIG. 11H is a lower left perspective view, and FIG. 11I is a lower right perspective view. The contact 71 is configured to be the same as the contact 1, except for the components described below. Thus, reference numbers added with a number 70 to the reference numbers used in FIGS. 1A-1G and FIGS. 2A-2B are used for part of the components in the present embodiment, and detailed description thereof is not repeated.

In the contact 71 as well, a hole section 73C reaches a lower end of an elastic contact portion 73. Between the hole section 73C and a connecting section to a solder bonding portion 72, a connecting section between the solder bonding portion 72 and a suction portion 74 is arranged in a convex shape. The suction portion 74 is formed by raising a portion punched out as the hole section 73C upward from the solder bonding portion 72 to penetrate the hole section 73C. A top end 74B of the suction portion 74 is also bent to a direction parallel to the solder bonding portion 72. A bend 73A of the elastic contact portion 73 is largely curved in a U-shape when viewed from front. Further, the elastic contact portion 73 is largely curved to be folded in a U-shape when viewed from front via a bend 73E also in its middle. The elastic contact portion 73 is configured into an S-shape when viewed from front as a whole. A top end 73B of the elastic contact portion 73 is bent upward and then curled in arch shape of about 270° when viewed from front. Further, the hole section 73C is formed to extend over the bend 73E.

The contact 71 of Embodiment 7 configured as such can be also sucked by the suction nozzle 930 (see FIGS. 2A-2B). The same operation/effect as in the contact 1 can be achieved. Also, in the contact 71, the suction portion 74 is formed by cutting and raising part of the elastic contact portion 73. Thus, loss of metal can be reduced. Further, in the contact 71, the elastic contact portion 73 is formed into an S-shape when viewed from front by increasing R (curvature radius) of the bends 73A and 73E. Thus, a projected area of the elastic contact portion 73 to the solder bonding portion 72 can be restricted. Also, while protrusion of the elastic contact portion from an area directly above the solder bonding portion 72 is restricted upon compression of the elastic contact portion 73, a spring constant of the elastic contact portion 73 can be easily designed to a desired value.

[Embodiment 8]

Figure 12A:
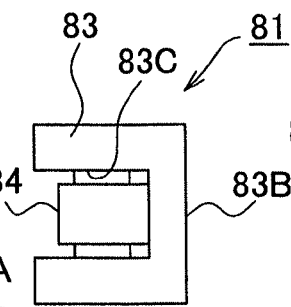
FIGS. 12A-12I are views showing a structure of a contact 81 according to a eighth embodiment of the present invention, where
Figure 12F:
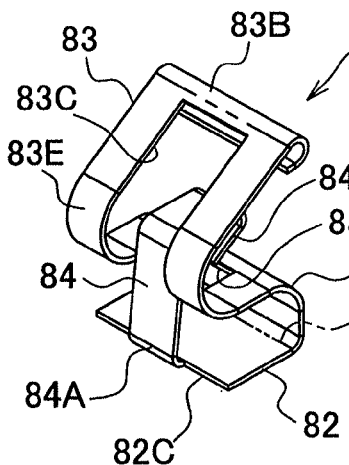
Figure 12G:
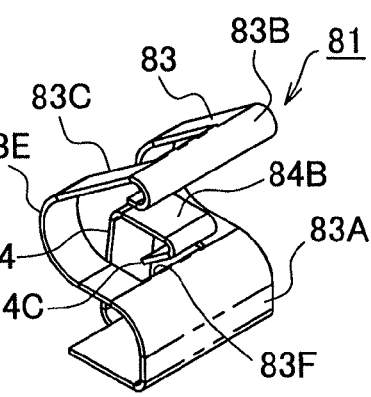
Figure 12B:
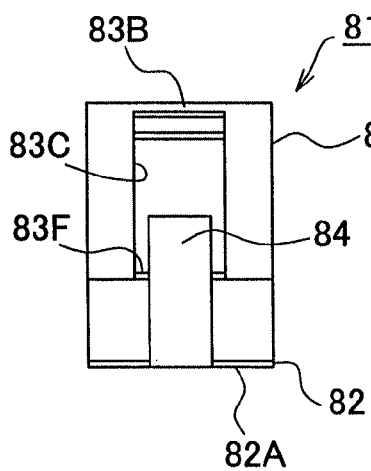
Figure 12C:
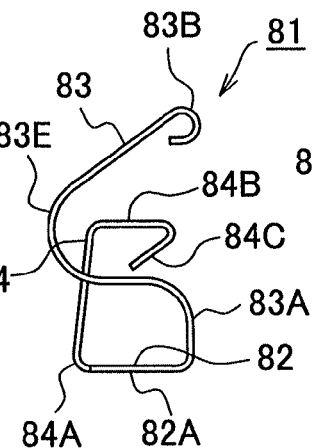
Figure 12D:
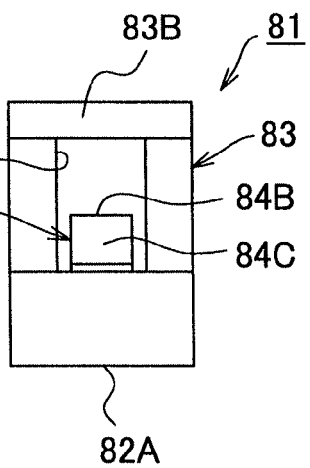
Figure 12H:
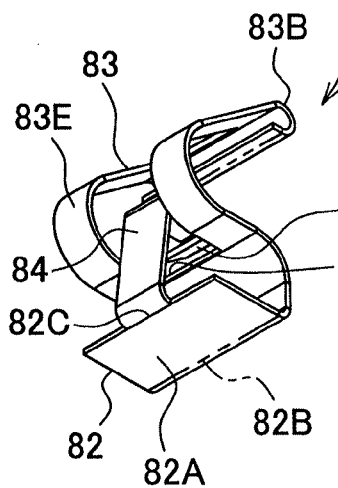
Figure 12E:
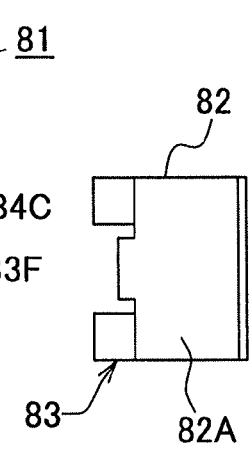
Figure 12I:
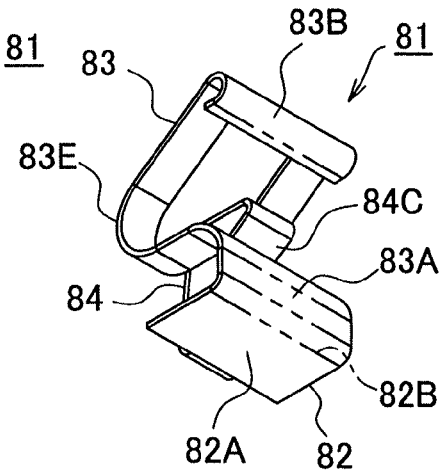

FIGS. 12A-12I are views showing a structure of a contact 81 according to Embodiment 8 of the present invention, where FIG. 12A is a plan view, FIG. 12B is a left side view, FIG. 12C is a front view, FIG. 12D is a right side view, FIG. 12E is a bottom view, FIG. 12F is an upper left perspective view, FIG. 12G is an upper right perspective view, FIG. 12H is a lower left perspective view, and FIG. 12I is a lower right perspective view. The contact 81 is configured to be the same as the contact 1, except for the components described below. Thus, reference numbers added with a number 80 to the reference numbers used in FIGS. 1A-1G and FIGS. 2A-2B are used for part of the components in the present embodiment, and detailed description thereof is not repeated.

In the contact 81, a solder bonding portion 82 is formed into a rectangular parallelepiped. An elastic contact portion 83 is connected to one end 82B of the solder bonding portion 82. A suction portion 84 is connected to a center of an other end 82C of the solder bonding portion 82. A tip of a top end 84B of the suction portion 84 arranged in parallel to the solder bonding portion 82 forms a folded piece 84C which is folded down toward a bend 84A. An underside edge 83F of a hole section 83C of the elastic contact portion 83 faces the folded piece 84C in an up and down direction above the solder bonding portion 82.

A bend 83A of the elastic contact portion 83 is raised perpendicularly at first and then largely curved. Further the elastic contact portion 83 is largely curved via a bend 83E at its middle and folded. A top end 83B of the elastic contact portion 83 is curled downward in arch shape. Further, the hole section 83C is formed to extend over the bend 83E.

Even in the contact 81 of Embodiment 8 configured as such, the top end 84B of the suction portion 84 can be sucked by the suction nozzle 930 (see FIGS. 2A-2B). The same operation/effect as in the contact 1 can be achieved. Also, even in the contact 81, R (curvature radius) of the bends 83A and 83E is increased. Thus, a projected area of the elastic contact portion 83 to the solder bonding portion 82 can be restricted. Also, while protrusion of the elastic contact portion from an area directly above the solder bonding portion 82 is restricted upon compression of the elastic contact portion 83, a spring constant of the elastic contact portion 83 can be easily designed to a desired value. Further, in the contact 81, if an excessive load is applied to the top end 84B of the suction portion 84, the folded piece 84C abuts on the underside edge 83F of the hole section 83C. Thereby, displacement of the top end 84B can be inhibited.

[Embodiment 9]

Figure 13F:
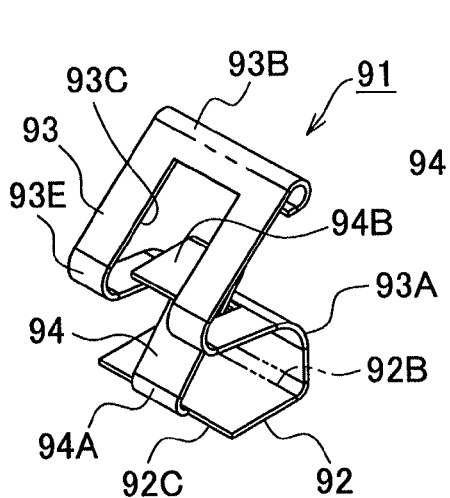
FIGS. 13A-13I are views showing a structure of a contact 91 according to a ninth embodiment of the present invention, where
Figure 13A:
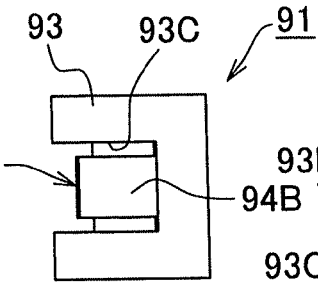
Figure 13G:
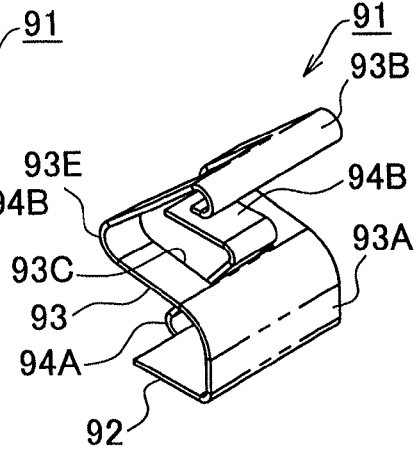
Figure 13B:
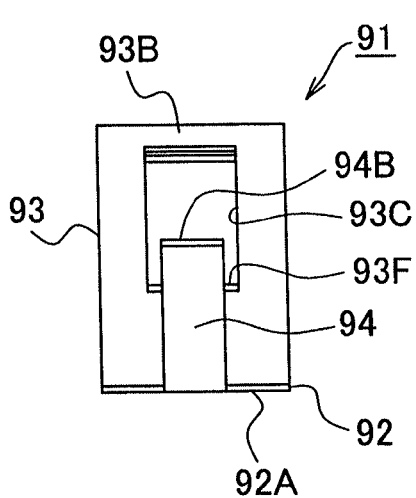
Figure 13C:
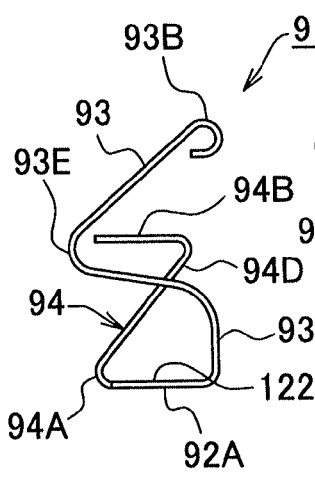
Figure 13D:
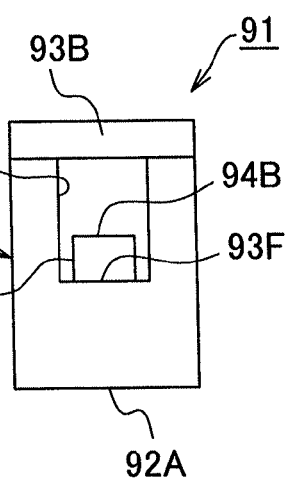
Figure 13H:
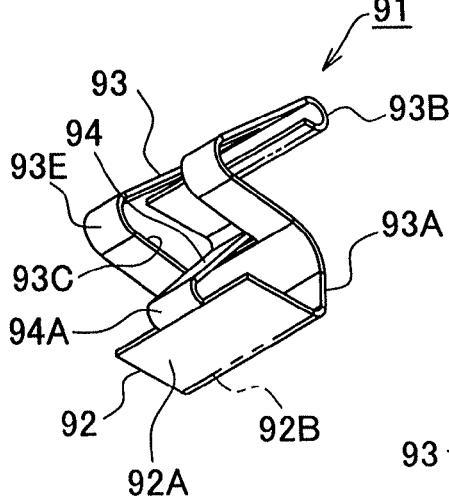
Figure 13E:
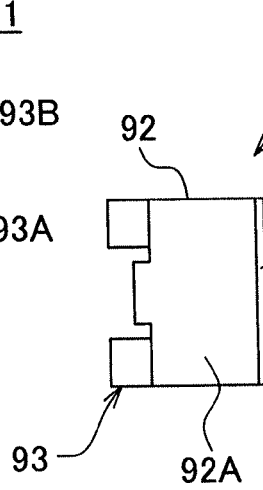
Figure 13I:
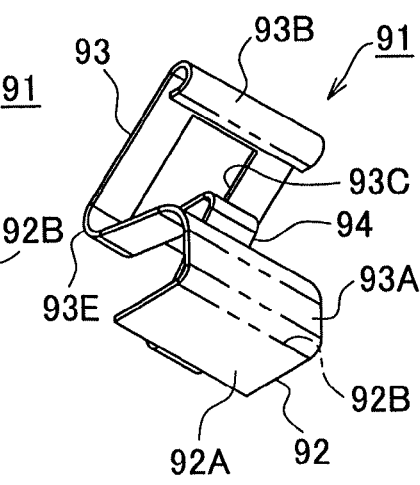

FIGS. 13A-13I are views showing a structure of a contact 91 according to Embodiment 9 of the present invention, where FIG. 13A is a plan view, FIG. 13B is a left side view, FIG. 13C is a front view, FIG. 13D is a right side view, FIG. 13E is a bottom view, FIG. 13F is an upper left perspective view, FIG. 13G is an upper right perspective view, FIG. 13H is a lower left perspective view, and FIG. 13I is a lower right perspective view. The contact 91 is different from the contact 81 only in the configuration of a suction portion 94. A solder bonding portion 92 and an elastic contact portion 93 are configured to be substantially the same as those in the contact 81. Thus, reference numbers added with a number 10 to the reference numbers used in FIGS. 12A-12I are used for part of the components in the present embodiment, and detailed description thereof is not repeated.

In the contact 91, the suction portion 94 is folded, making an acute angle with a bend 94A. A top end 94B of the suction portion 94 is folded in a direction opposite to the folded direction and is arranged in parallel to the solder bonding portion 92. Thus, an intermediate portion 94D of the suction portion 94 faces an underside edge 93F of a hole section 93C of the elastic contact portion 93 in an up and down direction.

Even in the contact 91 of Embodiment 9 configured as such, the top end 94B of the suction portion 94 can be sucked by the suction nozzle 930 (see FIGS. 2A-2B). The same operation/effect as in the contact 1 can be achieved. Also, even in the contact 91, R (curvature radius) of the bends 93A and 93E is increased. Thus, a projected area of the elastic contact portion 93 to the solder bonding portion 92 can be restricted. Also, while protrusion of the elastic contact portion from an area directly above the solder bonding portion 92 is restricted upon compression of the elastic contact portion 93, a spring constant of the elastic contact portion 93 can be easily designed to a desired value. Further, in the contact 91, if an excessive load is applied to the top end 94B of the suction portion 94, the intermediate portion 94D of the suction portion 94 abuts on the underside edge 93F of the hole section 93C. Thereby, displacement of the top end 94B can be inhibited.

[Embodiment 10]

FIGS. 14A-14I are views showing a structure of a contact 101 according to Embodiment 10 of the present invention, where FIG. 14A is a plan view, FIG. 14B is a left side view, FIG. 14C is a front view, FIG. 14D is a right side view, FIG. 14E is a bottom view, FIG. 14F is an upper left perspective view, FIG. 14G is an upper right perspective view, FIG. 14H is a lower left perspective view, and FIG. 14I is a lower right perspective view. The contact 101 is configured to be the same as the contact 1, except for the components described below. Thus, reference numbers added with a number 100 to the reference numbers used in FIGS. 1A-1G and FIGS. 2A-2B are used for part of the components in the present embodiment, and detailed description thereof is not repeated.

In the contact 101, a solder bonding portion 102 is formed into a rectangular parallelepiped. An elastic contact portion 103 is connected to one end 102B of the solder bonding portion 102. A suction portion 104 is connected to a center of an other end 102C of the solder bonding portion 102. The elastic contact portion 103 is largely curved in a U-shape when viewed from front. Further, the elastic contact portion 73, as in the elastic contact portion 73 shown in FIGS. 11A-11I, is largely curved in a U-shape via bends 103A and 103E to be folded. Thereby, the elastic contact portion 103 is configured as a whole into an S-shape when viewed from front. A top end 103B of the elastic contact portion 103 is bent upward and further curled. Also, a top end 104B of the suction portion 104 is arranged at a position higher than the suction portion 4. Although a hole section 103C does not reach to a lower end of the elastic contact portion 103, the hole section 103C is of size not to be brought into contact with the suction portion 104.

Even in the contact 101 of Embodiment 10 configured as such, the top end 104B of the suction portion 104 can be sucked by the suction nozzle 930 (see FIGS. 2A-2B). The same operation/effect as in the contact 1 can be achieved. Also, even in the contact 101, the elastic contact portion 103 is formed into an S-shape when viewed from front by increasing R (curvature radius) of the bends 103A and 103E. Thus, a projected area of the elastic contact portion 103 to the solder bonding portion 102 can be restricted. Also, while protrusion of the elastic contact portion from an area directly above the solder bonding portion 102 is restricted upon compression of the elastic contact portion 103, a spring constant of the elastic contact portion 103 can be easily designed to a desired value.

[Embodiment 11]

FIGS. 15A-15I are views showing a structure of a contact 111 according to Embodiment 11 of the present invention, where FIG. 15A is a plan view, FIG. 15B is a left side view, FIG. 15C is a front view, FIG. 15D is a right side view, FIG. 15E is a bottom view, FIG. 15F is an upper left perspective view, FIG. 15G is an upper right perspective view, FIG. 15H is a lower left perspective view, and FIG. 15I is a lower right perspective view. The contact 111 is different from the contact 81 in that a hole section 113C of an elastic contact portion 113 is opened to a top end of the elastic contact portion 113, and the top end 113B is separated into two. Other components are configured to be substantially the same as those in the contact 81. Thus, reference numbers added with a number 30 to the reference numbers used in FIGS. 12A-12I are used for part of the components in the present embodiment, and detailed description thereof is not repeated. In the contact 111 configured as such, there are not only the same effect as in the contact 81 but also an effect such that a contact with the ground conductor 920 can be multiple contacts.

[Embodiment 12]

FIGS. 16A-16I are views showing a structure of a contact 121 according to Embodiment 12 of the present invention, where FIG. 16A is a plan view, FIG. 16B is a left side view, FIG. 16C is a front view, FIG. 16D is a right side view, FIG. 16E is a bottom view, FIG. 16F is an upper left perspective view, FIG. 16G is an upper right perspective view, FIG. 16H is a lower left perspective view, and FIG. 16I is a lower right perspective view. The contact 121 is different from the contact 91 in that R (curvature radius) of bends 123A and 123E is further increased and that heights of the elastic contact portion 123 and a suction portion 124 are further increased. Other components are configured to be substantially the same as those in the contact 91. Thus, reference numbers added with a number 30 to the reference numbers used in FIGS. 13A-13I are used for part of the components in the present embodiment, and detailed description thereof is not repeated. In the contact 121 configured as such, there are not only the same effect as in the contact 91 but also an effect such that designing of a spring constant of the elastic contact portion 123 to a desired value can be all the more easy.

[Embodiment 13]

FIGS. 17A-17I are views showing a structure of a contact 131 according to Embodiment 13 of the present invention, where FIG. 17A is a plan view, FIG. 17B is a left side view, FIG. 17C is a front view, FIG. 17D is a right side view, FIG. 17E is a bottom view, FIG. 17F is an upper left perspective view, FIG. 17G is an upper right perspective view, FIG. 17H is a lower left perspective view, and FIG. 17I is a lower right perspective view. The contact 131 is configured to be the same as the contact 51, except for the components described below. Thus, reference numbers added with a number 80 to the reference numbers used in FIGS. 9A-9G are used for part of the components in the present embodiment, and detailed description thereof is not repeated.

In the contact 131, a pair of protrusions 133H are provided further upward from vicinities of both side edges at an upper end portion of a top end 133B of an elastic contact portion 133. Even in the contact 131 of Embodiment 13 configured as such, the top end 134B of the suction portion 134 can be sucked by the suction nozzle 930 (see FIGS. 2A-2B). The same operation/effect as in the contact 51 can be achieved.

Various modes other than the above-described embodiments can be taken to implement the present invention. For example, a suction portion may be connected to a side adjacent to the one end 2B of the solder bonding portion 2. In this case as well, the same operation/effect as in Embodiment 1 and others described above can be achieved if a top end of the suction portion is arranged in parallel to the solder bonding portion 2 at a side above the elastic contact portion 3 and below the top end 3B of the elastic contact portion 3.

The invention claimed is:

1. A contact formed by bending a thin metal plate,
   the contact being surface mounted on a mounting surface of a printed wiring board when used, and clamped between the printed wiring board and a conductive member, which is different from the printed wiring board, thereby to electrically connect a conductor pattern provided in the printed wiring board and the conductive member,
   the contact comprising:
   a solder bonding portion of which undersurface is a solder bonding face to be solder bonded to the conductor pattern;
   an elastic contact portion that is connected to one end of the solder bonding portion and bent over the solder bonding portion, the elastic contact portion being elastically deformed to be pressed against the conductive member when in contact with the conductive member; and
   a suction portion that is connected to the solder bonding portion independently of the elastic contact portion, a top end of the suction portion being arranged in parallel to the undersurface of the solder bonding portion on the conductive member side of the elastic contact portion, and thereby the suction portion being made a suction face for a suction nozzle of an automatic mounter;
   wherein the suction portion penetrates a hole section provided in the elastic contact portion; and
   the hole section is sized such that the suction portion does not disturb the elastic deformation of the elastic contact portion.

2. The contact according to claim 1, wherein
   a shape of the elastic contact portion projected onto the solder bonding face is identical to the solder bonding face or includes the solder bonding face.

3. The contact according to claim 2, wherein
   a length from the one end of the solder bonding portion to a top end of the elastic contact portion is longer than a length from the one end of the solder bonding portion to the other end of the solder bonding portion.

4. The contact according to claim 2, formed by bending one sheet of thin metal plate.

5. The contact according to claim 1, wherein
   a length from the one end of the solder bonding portion to a top end of the elastic contact portion is longer than a length from the one end of the solder bonding portion to the other end of the solder bonding portion.

6. The contact according to claim 5, formed by bending one sheet of thin metal plate.

7. The contact according to claim 1, formed by bending one sheet of thin metal plate.

8. A contact formed by bending a thin metal plate, the contact being surface mounted on a mounting surface of a printed wiring board when used, and clamped between the printed wiring board and a conductive member, which is different from the printed wiring board, thereby to electrically connect a conductor pattern provided in the printed wiring board and the conductive member, the contact comprising:

a solder bonding portion of which undersurface is a solder bonding face to be solder bonded to the conductor pattern;

an elastic contact portion that is connected to one end of the solder bonding portion and bent over the solder bonding portion, the elastic contact portion being elastically deformed to be pressed against the conductive member when in contact with the conductive member;

a suction portion that is connected between a bent-over portion where the elastic contact portion is bent and a contact portion where the elastic contact portion is brought into contact with the conductive member, the suction portion being arranged in parallel to the undersurface of the solder bonding portion on the conductive member side of the elastic contact portion, and thereby, the suction portion being made a suction face for a suction nozzle of an automatic mounter; and a defining portion that is connected to the suction portion, the defining portion being arranged at a position to be able to define a distance between the suction portion and the solder bonding portion when the elastic contact portion is not elastically deformed, and when the elastic contact portion is elastically deformed, the defining portion being displaced along with the elastic deformation, so as to be arranged at a position not to obstruct the elastic deformation of the elastic contact portion.

9. The contact according to claim 8, wherein a lower end of the defining portion is bent to a direction following the undersurface of the solder bonding portion, a frame portion which surrounds the lower end of the defining portion when the elastic contact portion is not elastically deformed is provided in the solder bonding portion, and, when the elastic contact portion is elastically deformed, the lower end of the defining portion goes out of the frame portion along with the elastic deformation.

10. The contact according to claim 9, wherein a shape of the elastic contact portion projected onto the solder bonding face is identical to the solder bonding face or includes the solder bonding face.

11. The contact according to claim 9, wherein a length from the one end of the solder bonding portion to a top end of the elastic contact portion is longer than a length from the one end of the solder bonding portion to the other end of the solder bonding portion.

12. The contact according to claim 9, formed by bending one sheet of thin metal plate.

13. The contact according to claim 8, wherein a shape of the elastic contact portion projected onto the solder bonding face is identical to the solder bonding face or includes the solder bonding face.

14. The contact according to claim 8, wherein a length from the one end of the solder bonding portion to a top end of the elastic contact portion is longer than a length from the one end of the solder bonding portion to the other end of the solder bonding portion.

15. The contact according to claim 8, formed by bending one sheet of thin metal plate.

* * * * *